(12) United States Patent
Kim et al.

(10) Patent No.: US 11,508,941 B2
(45) Date of Patent: Nov. 22, 2022

(54) DISPLAY APPARATUS INCLUDING SEMI-TRANSMISSIVE MIRROR

(71) Applicant: LG Display Co., Ltd., Seoul (KR)

(72) Inventors: JongSung Kim, Paju-si (KR); TaeHan Park, Paju-si (KR); Howon Choi, Paju-si (KR); Dongyoung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 63 days.

(21) Appl. No.: 17/135,912

(22) Filed: Dec. 28, 2020

(65) Prior Publication Data

US 2021/0202915 A1 Jul. 1, 2021

(30) Foreign Application Priority Data

Dec. 30, 2019 (KR) .................. 10-2019-0177368

(51) Int. Cl.
*H01L 51/00* (2006.01)
*H01L 51/50* (2006.01)
(Continued)

(52) U.S. Cl.
CPC ...... *H01L 51/5271* (2013.01); *H01L 27/3234* (2013.01); *H01L 27/3244* (2013.01);
(Continued)

(58) Field of Classification Search
CPC ............. H01L 51/5271; H01L 51/0097; H01L 51/524; H01L 51/5281; H01L 51/5262; H01L 51/5056; H01L 51/5072; H01L 51/5293; H01L 51/5246; H01L 51/5218; H01L 51/5088; H01L 51/5092; H01L 51/5096; H01L 2251/301; H01L 2251/5338; H01L 27/3234; H01L 27/3244; H01L 27/3227; H01L 27/3297; H01L 27/3246; H01L 27/3295; H01L 27/3269;
(Continued)

(56) References Cited

U.S. PATENT DOCUMENTS

2007/0284346 A1* 12/2007 Choo ................ G02F 1/133528
219/121.76
2010/0165461 A1* 7/2010 Ninomiya .............. G02B 1/118
359/507

(Continued)

FOREIGN PATENT DOCUMENTS

KR 10-2017-0066535 A 6/2017

*Primary Examiner* — Ida M Soward
(74) *Attorney, Agent, or Firm* — Polsinelli PC

(57) ABSTRACT

A display apparatus includes a display panel having a front area and a side area, a main body supporting the display panel, an auxiliary member arranged inside the main body, and a semi-transmissive mirror arranged between the auxiliary member and the front area, wherein the side area of the display panel may be arranged inside the main body to face the semi-transmissive mirror. Since an image partially emitted from the display panel may be reflected toward the front area, auxiliary members such as a camera, an illumination sensor, and a proximity sensor may be arranged inside the main body (or below a display) to embody a full screen display, whereby a user's satisfaction may be enhanced and a manufacturing process may be simplified.

20 Claims, 20 Drawing Sheets

(51) Int. Cl.
  *H01L 51/52* (2006.01)
  *H01L 27/32* (2006.01)
  *G02F 1/1335* (2006.01)
  *G02F 1/1333* (2006.01)
(52) U.S. Cl.
  CPC ........ *H01L 51/0097* (2013.01); *H01L 51/524* (2013.01); *H01L 51/5281* (2013.01); *G02F 1/133331* (2021.01); *G02F 1/133528* (2013.01); *H01L 27/3211* (2013.01); *H01L 27/3246* (2013.01); *H01L 27/3269* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5218* (2013.01); *H01L 51/5246* (2013.01); *H01L 51/5293* (2013.01); *H01L 2251/301* (2013.01); *H01L 2251/5338* (2013.01)
(58) Field of Classification Search
  CPC ........... H01L 27/3211; G02F 1/133331; G02F 1/133528
  See application file for complete search history.

(56) References Cited

U.S. PATENT DOCUMENTS

| | | | |
|---|---|---|---|
| 2014/0002975 A1* | 1/2014 | Lee | B32B 37/0046 156/196 |
| 2014/0183342 A1* | 7/2014 | Shedletsky | H01L 27/3227 250/215 |
| 2015/0370075 A1* | 12/2015 | Ato | G02B 27/0172 359/240 |
| 2017/0123263 A1* | 5/2017 | Park | G02B 6/0055 |
| 2017/0139442 A1* | 5/2017 | Yoshizumi | G06F 1/1626 |
| 2017/0153376 A1* | 6/2017 | Onoda | G02B 6/0068 |
| 2017/0279074 A1* | 9/2017 | Ma | B32B 3/02 |
| 2017/0329073 A1* | 11/2017 | Liu | G02B 6/0053 |
| 2018/0120975 A1* | 5/2018 | Kim | G06F 3/04164 |
| 2018/0322325 A1* | 11/2018 | Lee | G02F 1/13338 |
| 2019/0207130 A1* | 7/2019 | He | H01L 51/003 |
| 2019/0392752 A1* | 12/2019 | Chen | G01J 1/4228 |
| 2020/0212120 A1* | 7/2020 | Yang | H01L 27/3213 |
| 2021/0063807 A1* | 3/2021 | Araki | G02F 1/13332 |
| 2021/0333618 A1* | 10/2021 | Zhang | G02F 1/1339 |

* cited by examiner

DISPLAY APPARATUS INCLUDING SEMI-TRANSMISSIVE MIRROR

CROSS REFERENCE TO RELATED APPLICATION

This application claims the priority benefit of Korean Patent Application No. 10-2019-0177368 filed on Dec. 30, 2019, which is hereby incorporated by reference in its entirety.

BACKGROUND

Field of the Disclosure

The present disclosure relates to a display apparatus outputting an image.

Description of the Background

Recently, with the advancement of the information age, a display field for processing and displaying mass information has been rapidly developed. In response to this trend, various flat panel display apparatuses have been developed and spotlighted.

Since the flat panel display apparatus uses a glass substrate to resist high heat generated during a manufacturing process, there is limitation in lightweight and thin profile and flexibility.

Therefore, a flexible display apparatus manufactured using a flexible material such as plastic instead of a glass substrate having no flexibility to maintain display performance even though it is bent like a paper has emerged as an advanced flat panel display apparatus.

Meanwhile, studies for embodying a front surface portion on which an image is output, as a full screen display have been actively ongoing in recent years.

The full screen display means an image apparatus in which a front surface portion is embodied as a full screen without a hole by arranging additional devices such as a camera, an illumination sensor and a proximity sensor, which are arranged to be protruded on the front surface portion, inside a main body (or below a display).

Since the additional devices may be arranged inside the main body (or below a display), the full screen display has no elements protruded outside the display, whereby a satisfaction may be given to a user in view of design. Also, since a hole does not need to be provided in the display arranged on a front surface portion, a manufacturing process may be simplified.

However, since there is limitation in embodying the full screen display using a glass substrate having no flexibility, studies for embodying the full screen display using a flexible display apparatus are actively ongoing.

SUMMARY

Accordingly, the present disclosure is to provide a display apparatus that may arrange additional devices such as a camera, an illumination sensor, and a proximity sensor inside a main body (or below a display) using a flexible display.

In accordance with an aspect of the present disclosure, the above and other objects can be accomplished by the provision of a display apparatus comprising a display panel having a front area and a side area, a main body supporting the display panel, an auxiliary member arranged inside the main body, and a semi-transmissive mirror arranged between the auxiliary member and the front area, wherein the side area of the display panel may be arranged inside the main body to face the semi-transmissive mirror.

In the display apparatus according to the present disclosure, as the display panel is partially arranged inside the main body to face the semi-transmissive mirror and an image emitted from the display panel is reflected toward a front area through the semi-transmissive mirror, auxiliary members such as a camera, an illumination sensor, and a proximity sensor are arranged inside the main body (or below a display) to embody a full screen display, whereby a user's satisfaction may be enhanced and a manufacturing process may be simplified.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Figure 1:
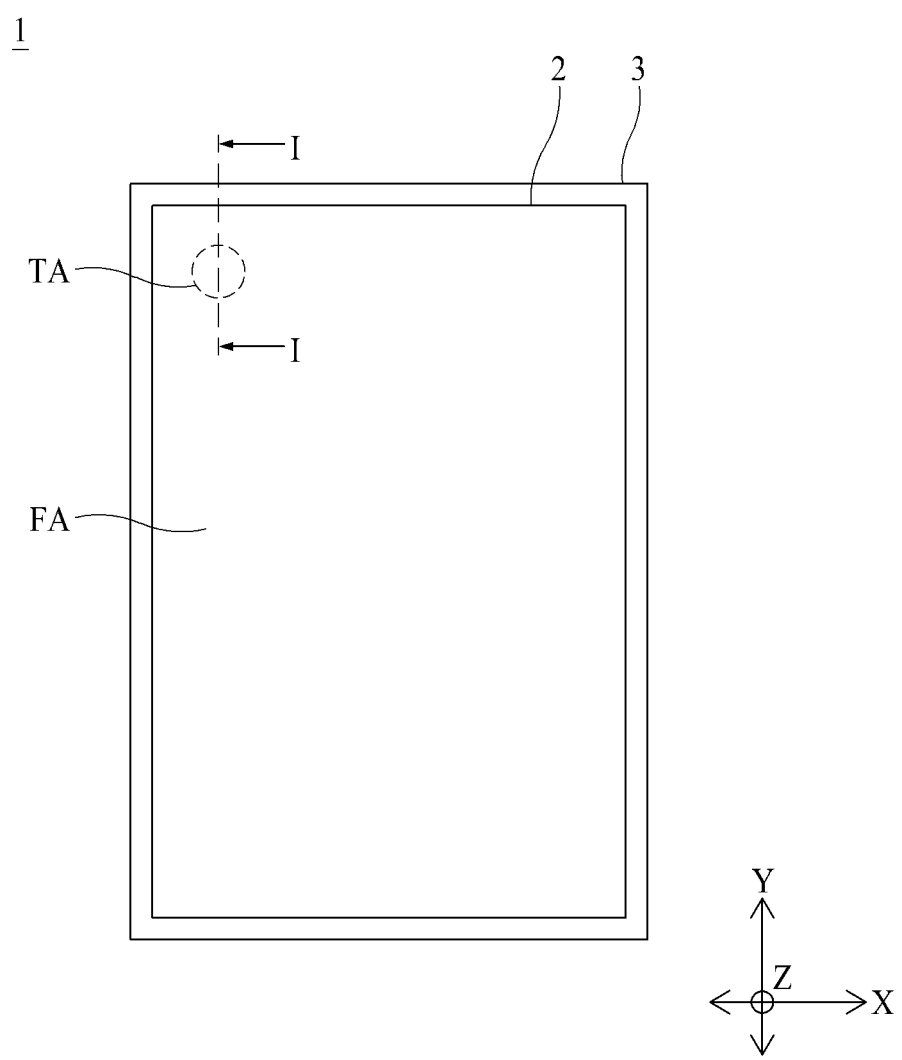
FIG. 1 is a brief plane view illustrating a display apparatus according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a display apparatus according to the present disclosure will be described in detail with reference to the accompanying drawings. Wherever possible, the same reference numbers will be used throughout the drawings to refer to the same or like parts.

Figure 2:
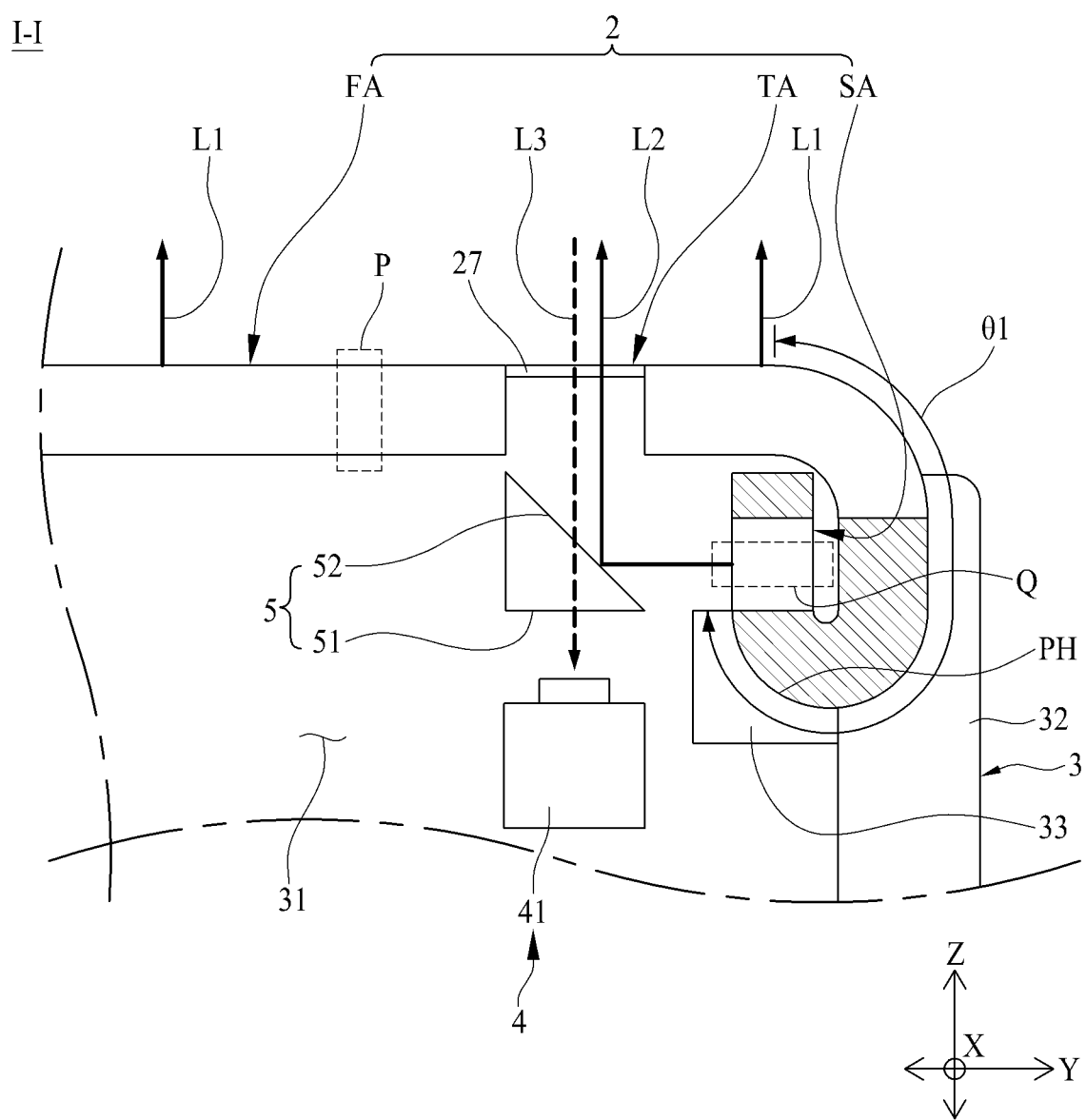
FIG. 2 is a brief cross-sectional view taken along line I-I shown in FIG. 1.
Figure 3:
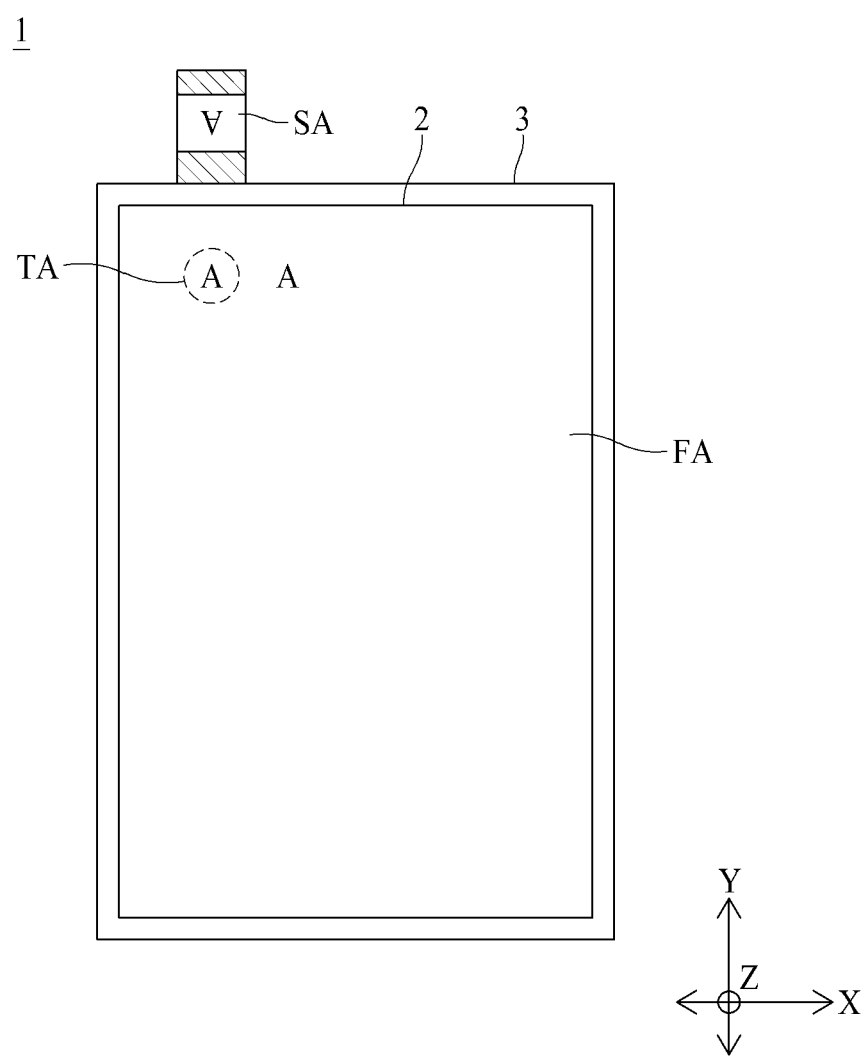
FIG. 3 is a brief front view when a side area is unfolded in FIG. 2.
Figure 4:
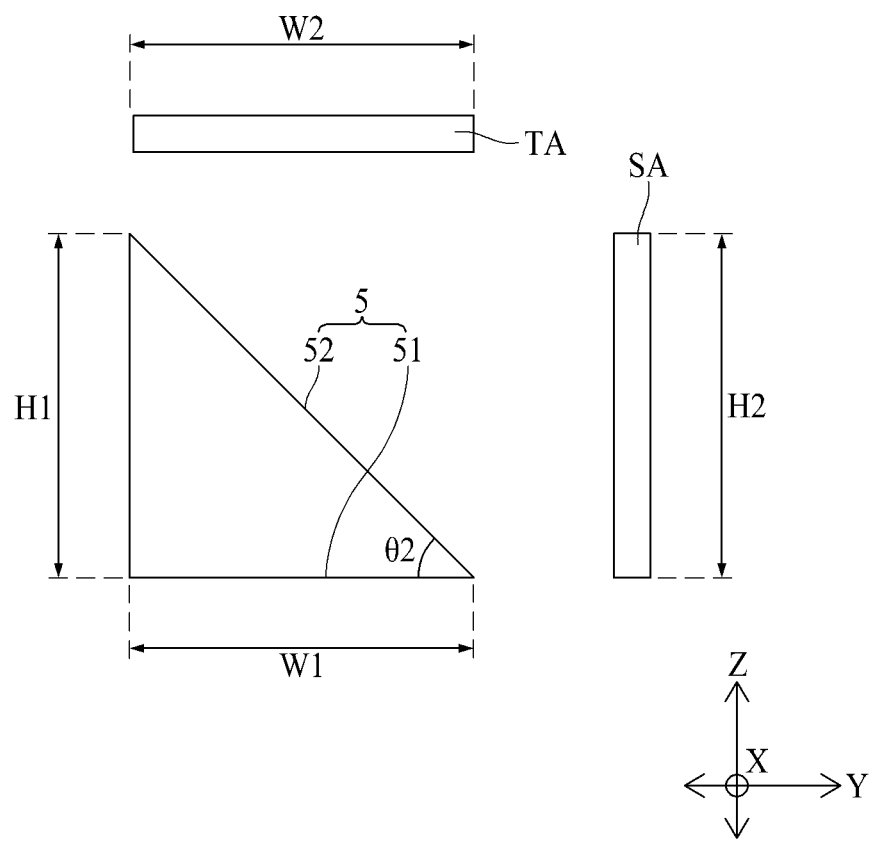
FIG. 4 is a brief arrangement view of FIG. 2.

FIG. 1 is a brief plane view illustrating a display apparatus according to one aspect of the present disclosure, FIG. 2 is a brief cross-sectional view taken along line I-I shown in FIG. 1, FIG. 3 is a brief front view when a side area is unfolded in FIG. 2, FIG. 4 is a brief arrangement view of FIG. 2, and FIGS. 5A to 5D are front views illustrating various aspects when a plurality of transmissive areas are provided in FIG. 3.

Referring to FIGS. 1 to 5D, the display apparatus 1 according to one aspect of the present disclosure comprises a display panel 2, a main body 3, an auxiliary member 4, and a semi-transmissive mirror 5. The display panel 2 includes a front area FA and a side area SA. The auxiliary member 4 may be arranged inside the main body 3 (or below the display panel 2). The side area SA of the display panel 2 is arranged to fact the semi-transmissive mirror 5 in the inside of the main body 3. The inside of the main body 3 may mean a lower portion of the display panel 2.

Image light L1 (shown in FIG. 2) emitted from the front area FA may be emitted toward a user. Image light L2 (shown in FIG. 2) emitted from the side area SA may be emitted toward the semi-transmissive mirror 5. The image light L2 reflected in the semi-transmissive mirror 5 may be emitted to the outside through a transmissive area TA included in the front area FA. The transmissive area TA is arranged to face the auxiliary member 4, and may be provided to be equal to or greater than a size (or a size of the semi-transmissive mirror 5) of the auxiliary member 4 in accordance with the aspect. In this case, the transmissive area TA provided to be equal to or greater than the size (or the size of the semi-transmissive mirror 5) of the auxiliary member 4 may mean a size of a transparent portion in the transmissive area TA. Therefore, the size of the semi-transmissive mirror 5 may be equal to or greater than the size of the transmissive area TA provided transparently. The transmissive area TA may be provided transparently to transmit image light or allow external light to enter there.

Meanwhile, the case that the side area SA and the semi-transmissive mirror 5 face each other may include the case that another structure is not arranged between the side area SA and the semi-transmissive mirror 5 and at least one of an emitted surface on which the image light L2 is emitted from the side area SA and an inclined surface 52 of the semi-transmissive mirror 5 is inclined to face the other one. Therefore, although FIG. 2 shows that the side area SA is arranged in parallel with Z axis direction and the inclined surface 52 is inclined with respect to the emitted surface of the side area SA, without limitation to this example, the inclined surface 52 and the emitted surface of the side area SA may not be arranged in parallel with Z axis direction. However, even in this case, the inclined surface 52 and the emitted surface of the side area SA should be provided such that the image light L2 emitted from the emitted surface of the side area SA may be emitted to the transmissive area TA through the inclined surface 52, and external light L3 (shown in FIG. 2) entering through the transmissive area TA may reach the auxiliary member 4 through the semi-transmissive mirror 5.

The display panel 2 may be a display apparatus emitting image light. The display panel 2 may be a flexible display panel manufactured using a flexible material such as plastic to maintain display performance even though it is bent like a paper. The display panel 2 according to one example may be a rectangular plate shape on the whole but may be another shape.

The front area FA of the display panel 2 may be a direction where a user may view an image output from the display apparatus 1 according to one aspect of the present disclosure. For another example, the front area FA may be an exposed area exposed to the outside without being covered by the main body 3. The image light L1 emitted from the front area FA based on FIG. 2 may be emitted toward an upward direction of Z axis direction, whereby the image light L1 may be seen to a user. The Z axis direction may be, but not limited to, a gravity direction.

The side area SA of the display panel 2 is an area connected with the front area FA, and may be an area from which the image light L2 is emitted from the inside of the main body 3. The side area SA is arranged in the inside of the main body 3 and therefore may be a non-exposed area covered by the main body 3. The side area SA, as shown in FIG. 2, may be arranged in the inside of the main body 3 in accordance with bending and folding of edge portions of the display panel 2.

The side area SA may be arranged to have a first angle $\theta 1$ with respect to the front area FA. In more detail, after the edge portions of the display panel 2 are bent at 90° and then folded at 180°, the side area SA may be arranged to face the semi-transmissive mirror 5. Therefore, the side area SA may be arranged to have an angle of about 270° with respect to the front area FA. As a result, the first angle $\theta 1$ may be about 270°. In the display apparatus 1 according to one aspect of the present disclosure, the first angle $\theta 1$ may be, but not limited to, about 270°. The first angle $\theta 1$ may be provided at another angle if it may emit the image light L2 emitted from the side area SA to the transmissive area TA through the semi-transmissive mirror 5. The side area SA may maintain the first angle $\theta 1$ with respect to the front area FA by being supported in the main body 3.

As the side area SA may be provided to have the first angle $\theta 1$ with respect to the front area FA, before the side area SA is bent and folded, that is, when the side area SA is unfolded, the side area SA and the front area FA may emit the image light in the same direction. Since this means that the image light may be emitted from the front area FA and the side area SA of one display panel 2, arrangement of a line, etc. may not be considered as compared with the case that a separate display panel 2 is provided in the side area SA, whereby a manufacturing process may be simplified. As a result, in the display apparatus 1 according to one aspect of the present disclosure, all of the front area FA, the side area SA and the transmissive area TA may be arranged on one display panel 2.

Meanwhile, referring to FIG. 2, the image light L2 emitted from the side area SA may be emitted toward the semi-transmissive mirror 5 in Y axis direction, reflected from the semi-transmissive mirror 5 and then emitted to the transmissive area TA. Therefore, a user located in a direction of the front area FA may view a mixed light of the image light L1 emitted from the front area FA and the image light L2 emitted from the side area SA. The image light L2 emitted from the side area SA may be emitted through a separate algorithm as much as a size of the transmissive area TA, whereby the user may view the image light L2 with uniformity with the image light L1 emitted from the front area FA. The Y axis direction may be a direction vertical to the Z axis direction. For example, the Y axis direction may be a vertical direction based on FIG. 1. X axis direction is a direction vertical to each of the Y axis direction and the Z axis direction, and may be a direction indicating a width of the display apparatus 1 according to one aspect of the present disclosure. For example, the X axis direction may be a left and right direction based on FIG. 1.

Meanwhile, as described above, in order that a user views a combined image of the image light L1 emitted from the front area FA and the image light L2 emitted from the side area SA without sense of difference, the side area SA may emit an image up and down inverted from the image emitted from the front area FA toward the semi-transmissive mirror 5. For example, as shown in FIG. 3, supposing that 'A' is emitted from the front area FA, an inverted 'A' which is up and down inverted may be emitted from the side area SA, and the image emitted to the transmissive area TA through the semi-transmissive mirror 5 may be emitted in the same shape as 'A' emitted through the front area FA, whereby a user may view the image without sense of difference. That is, the up and down inverted image emitted from the side area SA may be reflected in the semi-transmissive mirror 5 and emitted from the transmissive area TA without up and down inversion, and the image emitted from the transmissive area TA may have uniformity with the image emitted from the front area FA.

Meanwhile, the front area FA may include the transmissive area TA to emit the image light L2 emitted from the side area SA to the outside through the semi-transmissive mirror 5. The transmissive area TA is a portion of the front area FA, and may be arranged in a direction of a user. The transmissive area TA may be arranged between the front area FA and the side area SA. In this case, the case that the transmissive area TA is arranged between the front area FA and the side area SA means that the transmissive area TA is arranged between a center portion of the front area FA and the side area SA. The center portion of the front area FA may mean a middle portion of an area where an image is seen to a user in the display apparatus of the present disclosure. Therefore, another portion of the front area FA may be arranged between the side area SA and the center portion of the front area FA. In this case, the transmissive area TA may be arranged between the front area FA and another front area FA.

The transmissive area TA is a portion of the display panel 2, and may be provided so as not to emit an image. This is because that the auxiliary member 4 arranged in the inside of the main body 3 does not absorb external light well due to an emitted image if the image is emitted from the transmissive area TA. For example, if the auxiliary member 4 is a camera, external light absorbed by the camera may interfere with the emitted external light, whereby a problem may occur in that the image emitted by the camera may be seen to be blurred or diffused. Therefore, the transmissive area TA may be provided transparently to transmit the image light L2 reflected in the semi-transmissive mirror 5 and external light L3 of the auxiliary member 4 without outputting an image.

The transmissive area TA, as shown in FIG. 2, may be arranged in a position corresponding to the auxiliary member 4 such that the external light L3 may reach the auxiliary member 4. Therefore, a position of the transmissive area TA arranged in the front area FA may be varied depending on where the auxiliary member 4 is arranged inside the main body 3.

The display panel 2 may include a substrate 21, an anode 22, a light emitting layer 23, a cathode 24, an encapsulation layer 25, a polarizer 26, and a cover glass 27. A detailed description regarding these elements will be described together with FIG. 6.

Referring to FIGS. 1 and 2, the main body 3 is intended to support the display panel 2. The main body 3 forms an overall external appearance of the display apparatus 1 according to one aspect of the present disclosure, and may be made of, but not limited to, a hollow cuboid shape. The display panel 2 may be coupled to the main body 3 and supported by the main body 3. The display panel 2 may be coupled to the main body 3 through an adhesive member such as resin and double-sided tape.

The main body 3 may include a storage space 31 (shown in FIG. 2). The storage space 31 is intended to store the side area SA of the display panel 2, a printed circuit board for driving the display panel 2, a driving gear such as a battery, and the auxiliary member 4. The storage space 31 may be provided by, but not limited to, the display panel 2 and the main body 3. The storage space 31 may be provided by only the main body 3 if it may store the side area SA, the driving gear and the auxiliary member 4. The main body 3 may be formed of a metal material for rigidity, but may be formed of a plastic material for weight lightening.

The main body 3 may further include a vertical portion 32 and a protrusion 33.

The vertical portion 32, as shown in FIG. 2, is arranged in parallel with Z axis direction, and may be a portion that forms a bezel of the display apparatus 1 according to one aspect of the present disclosure.

The protrusion 33 is intended to allow the side area SA to maintain the first angle θ1 arranged inside the main body 3. The protrusion 33 may include a rounded groove PH protruded from the vertical portion 32 toward the inside of the main body 3 in parallel with Y axis direction. The edge portions of the display panel 2 may be bent at an angle of 90° by the vertical portion 32, and the display penal 2 bent at an angle of 90° may be inserted into the groove PH of the protrusion 33 and then folded at an angle of 180°. In the display panel 2, a portion which is in contact with the vertical portion 32 and a portion inserted into the groove PH may be coupled and fixed to the main body 3 by an adhesive member. Therefore, the side area SA may be maintained to be arranged in the inside of the main body 3, that is, the storage space 31 at the first angle θ1 to face the semi-transmissive mirror 5. Since the side area SA is a portion from which the image light L2 is emitted, the side area SA may not be covered by the protrusion 33.

Although not shown, as another example, in the display apparatus 1 according to one aspect of the present disclosure, a rear portion where the image light L2 is not emitted from the side area SA and a rear portion arranged from the vertical portion 32 of the main body 3 toward the inside of the main body 3 may be adhered to each other by an adhesive member, whereby the protrusion 33 may be omitted.

A spaced area (hatched portion) which is in contact with the vertical portion 32 and the protrusion 33 of the main body 3 is arranged between the front area FA and the side area SA. Since the spaced area is a non-light emitting area where light may not be emitted, an element that may form an electric field may not be arranged in the display panel 2 so as not to emit light. For example, the cathode 24 of the display panel 2 may not be arranged in the spaced area. This may be provided by patterning and removing the cathode 24 arranged in the spaced area when the display panel 2 is manufactured. If the cathode is not arranged in the spaced area, the anode 22 and an electric field are not formed, whereby light is not emitted. The non-light emitting area may be provided even in an area that does not face the semi-transmissive mirror 5 of the display panel 2 arranged inside the main body 3. For example, the non-light emitting area may be arranged even in an end portion of the display panel 2 shown in FIG. 2. The end portion of the display panel 2 may have a function of sealing a side of the side area SA to allow the side area SA not to be in contact with the air.

The auxiliary member 4 includes devices arranged inside the main body 3, and may be a camera 41, for example. Since the display apparatus 1 according to one aspect of the present disclosure is embodied as a full screen display, the auxiliary member 4 may be arranged in the storage space 31 such that the auxiliary member 4 may not be externally protruded. In this case, the auxiliary member 4 may be arranged to be spaced apart from the transmissive area TA of the display panel 2 at a predetermined distance in Z axis direction. This is to arrange the semi-transmissive mirror 5 between the auxiliary member 4 and the transmissive area TA. Therefore, the auxiliary member 4 may be spaced apart from the transmissive area TA as much as a height of the semi-transmissive mirror 5 or spaced apart from the transmissive area TA at a length longer than the height of the semi-transmissive mirror 5. However, if the auxiliary member 4 is too spaced apart from the transmissive area TA, since it is difficult to allow external light to reach the auxiliary member 4, the spaced length may be determined within the range that the external light may reach the auxiliary member 4. The auxiliary member 4 may include various devices, such as an illumination sensor, a proximity sensor and a speaker, as well as the camera 41 if they are arranged in the storage space 31.

Referring to FIG. 2 again, the semi-transmissive mirror 5 may partially reflect the image light L2 emitted from the side area SA to the transmissive area TA. The semi-transmissive mirror 5 may be arranged between the auxiliary member 4 and the transmissive area TA. In more detail, the semi-transmissive mirror 5 may be arranged between the auxiliary member 4 and the transmissive area TA while being arranged in one line in Z axis direction with the auxiliary member 4 and the transmissive area TA. That is, the semi-transmissive mirror 5 may be arranged below the transmissive area TA in Z axis direction and arranged to face the side area SA in Y axis direction. Although not shown, the semi-transmissive mirror 5 may directly be coupled to the main body 3 or coupled to an upper surface of a support member such as a mount arranged inside the main body 3, whereby the semi-transmissive mirror 5 may indirectly be coupled to the main body 3.

Since the semi-transmissive mirror 5 reflects 50% of light and transmits the other 50% of light, if luminance of the image light L2 emitted from the side area SA is 100, luminance of the image light L2 reflected toward the transmissive area TA may be 50.

Meanwhile, the semi-transmissive mirror 5 may transmit the external light L3 entering through the transmissive area TA toward the auxiliary member 4. Therefore, the external light L3 that has passed through the semi-transmissive mirror 5 after passing through the transmissive area TA may reach the auxiliary member 4 arranged below the semi-transmissive mirror 5. If the auxiliary member 4 is the camera 41, the camera 41 may sense the external light L3 that has passed through the transmissive area TA and the semi-transmissive mirror 5. In this case, the external light may mean light entering from a subject to be taken by the camera 41. Since the external light L3 entering the auxiliary member 4 passes through the transmissive area TA and the semi-transmissive mirror 5, if luminance of the external light L3 is 100, luminance of the external light L3 entering the auxiliary member 4 may be 50 or less. Therefore, the external light L3 entering the auxiliary member 4 may be amplified through a separate correction device or separate correction algorithm connected to the auxiliary member 4.

Figure 8A:
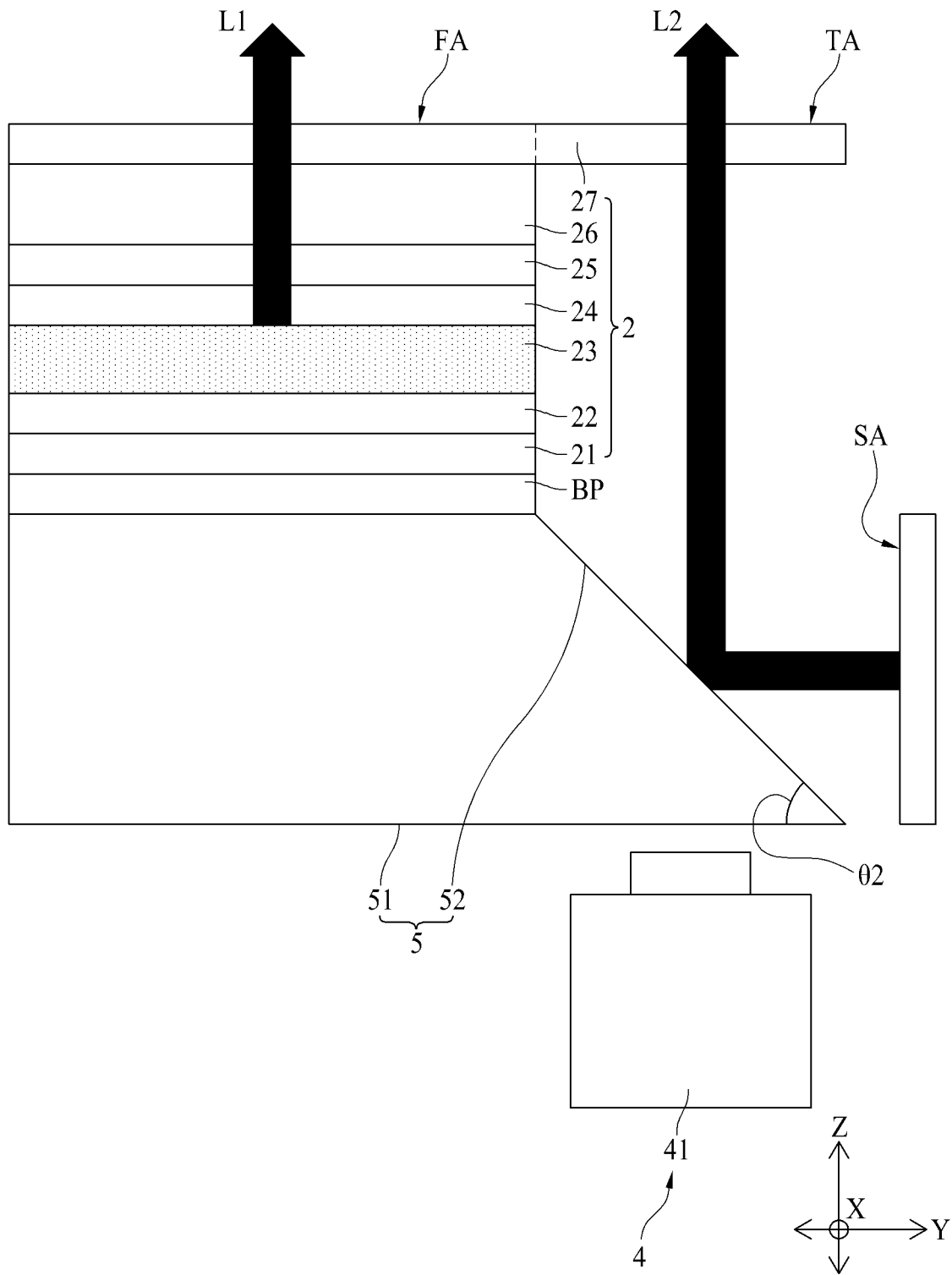
FIG. 8A is a detailed view of FIG. 2.

Consequently, the semi-transmissive mirror 5 may be made of a semi-transmissive material to reflect the image light L2 emitted from the side area SA to the transmissive area TA and transmit the external light L3 entering through the transmissive area TA to the auxiliary member 4. The semi-transmissive mirror 5 may be provided in a shape of, but not limited to, a triangular prism or a prism as shown in FIG. 4. The semi-transmissive mirror 5 may be provided in various shapes such as a prism shape of which sectional area is a trapezoid, as shown in FIG. 8A, if it may reflect the image light L2 emitted from the side area SA and transmit the external light L3 entering through the transmissive area TA. Hereinafter, a description will be given based on that the semi-transmissive mirror 5 is formed in a shape of a triangular prism.

The semi-transmissive mirror 5 may include a flat surface 51 and an inclined surface 52.

The flat surface 51 is a surface arranged to be parallel with the front area FA. As shown in FIG. 2, the auxiliary member 4 may be arranged below the flat surface 51. The flat surface 51 may be made of a transparent material that may transmit light.

The inclined surface 52 is a surface inclined with respect to the flat surface 51. The image light L2 emitted from the side area SA may be emitted to the transmissive area TA due to the inclined surface 52. As shown in FIG. 2, the inclined surface may be arranged to face the side area SA in Y axis direction, and may be arranged between the transmissive area TA and the flat surface 51 in Z axis direction. The inclined surface 52 may be made of a semi-transmissive material to reflect the image light L2 emitted from the side area SA to the transmissive area TA and transmit the external light L3 entering from the transmissive area TA to the auxiliary member 4. For example, the semi-transmissive material may be, but not limited to, a thin metal material. The semi-transmissive material may be made of another material if it may reflect 50% of the image light L2 and transmit 50% of the external light L3.

Meanwhile, in the display apparatus 1 according to one aspect of the present disclosure, a size of the semi-transmissive mirror 5 may be provided to be equal to or greater than the size of the transmissive area TA. For example, as shown in FIG. 4, a width W1 of the semi-transmissive mirror 5 may be provided to be equal to or greater than a width W2 of the transmissive area TA. Therefore, the image light L2 reflected in the inclined surface 52 may be emitted to the transmissive area TA. If the width W1 of the semi-transmissive mirror 5 is smaller than the width W2 of the transmissive area TA, even though the image light L2 reflected in the inclined surface 52 is emitted to the transmissive area TA, a gap is generated between the image light L2 emitted to the transmissive area TA and the image light L1 emitted from the front area FA except the transmissive area TA, whereby the images may not be emitted with uniformity. In this case, the transmissive area TA may be provided transparently.

Also, the size of the semi-transmissive mirror 5 may be provided to be equal to or greater than the size of the side area SA. For example, as shown in FIG. 4, a height H1 of the semi-transmissive mirror 5 may be provided to be equal to or greater than a height H2 of the side area SA. Therefore, the image light L2 reflected in the inclined surface 52 may be emitted to the transmissive area TA. If the height H1 of the semi-transmissive mirror 5 is smaller than the height H2 of the side area SA, since the image light L2 emitted from the side area SA is not reflected in the inclined surface 52, the image light L2 emitted from the side area SA may partially be emitted to the transmissive area TA without being fully emitted thereto. In this case, sense of difference may occur between the image light L2 emitted to the transmissive area TA and the image light L1 emitted from the front area FA except the transmissive area TA.

Consequently, in the display apparatus 1 according to one aspect of the present disclosure, as the size of the semi-transmissive mirror 5 may be provided to be equal to or greater than the size of the side area SA or provided to be equal to or greater than the size of the transmissive area TA, a gap or sense of difference may be prevented from being generated between the image light L1 emitted from the front area FA and the image light L2 emitted from the transmissive area TA, whereby images with uniformity may be embodied.

Figure 9A:
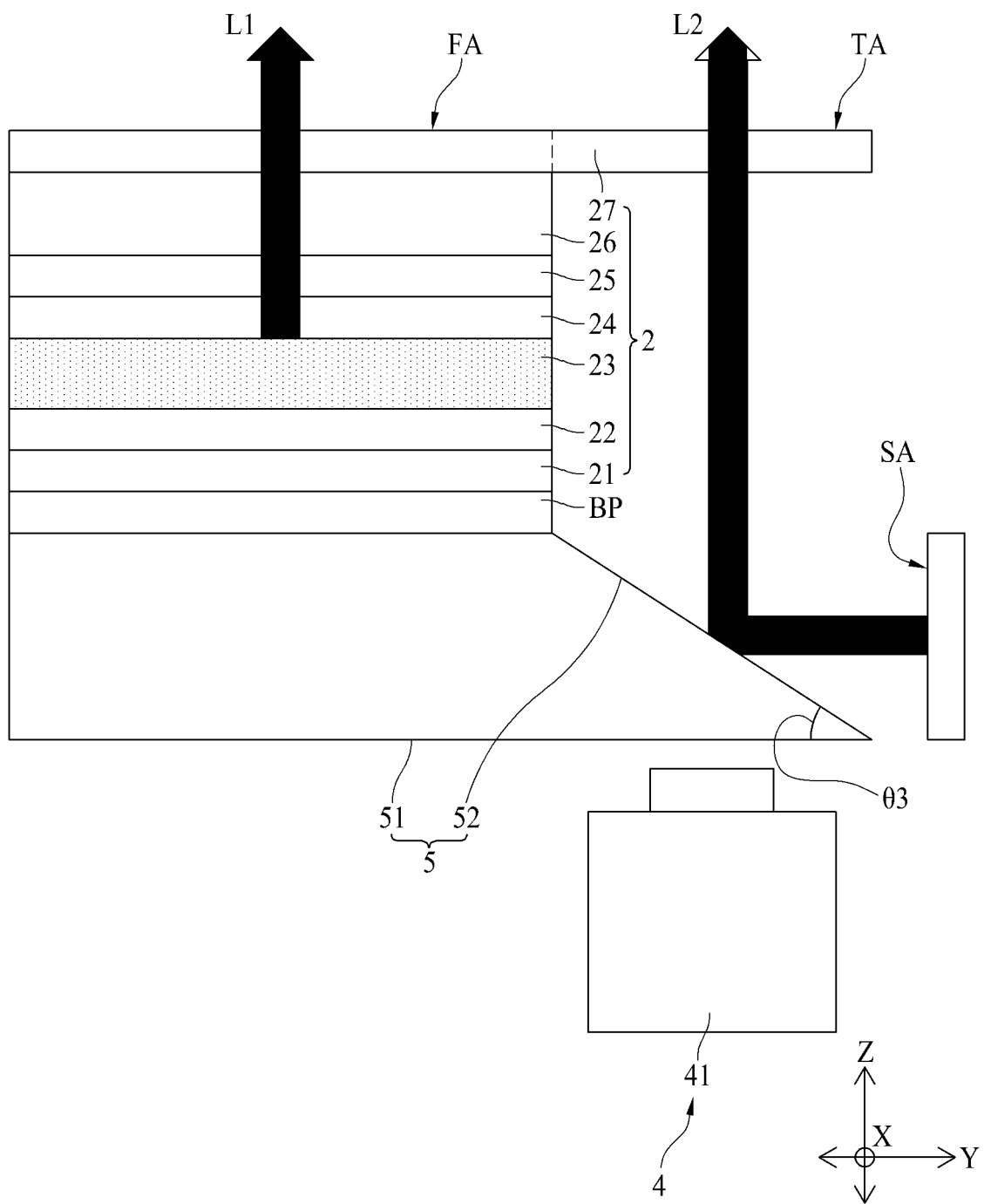
FIG. 9A is a brief cross-sectional view illustrating a display apparatus according to the second aspect of the present disclosure.

Meanwhile, the size of the semi-transmissive mirror 5 may be provided to be equal to both the size of the side area SA and the size of the transmissive area TA. However, the size of the side area SA and the size of the transmissive area TA may be provided to be different from each other as shown in FIG. 9A.

FIGS. 5A to 5D are front views illustrating various aspects when a plurality of transmissive areas are provided in the display apparatus 1 according to one aspect of the present disclosure.

Figure 5A:
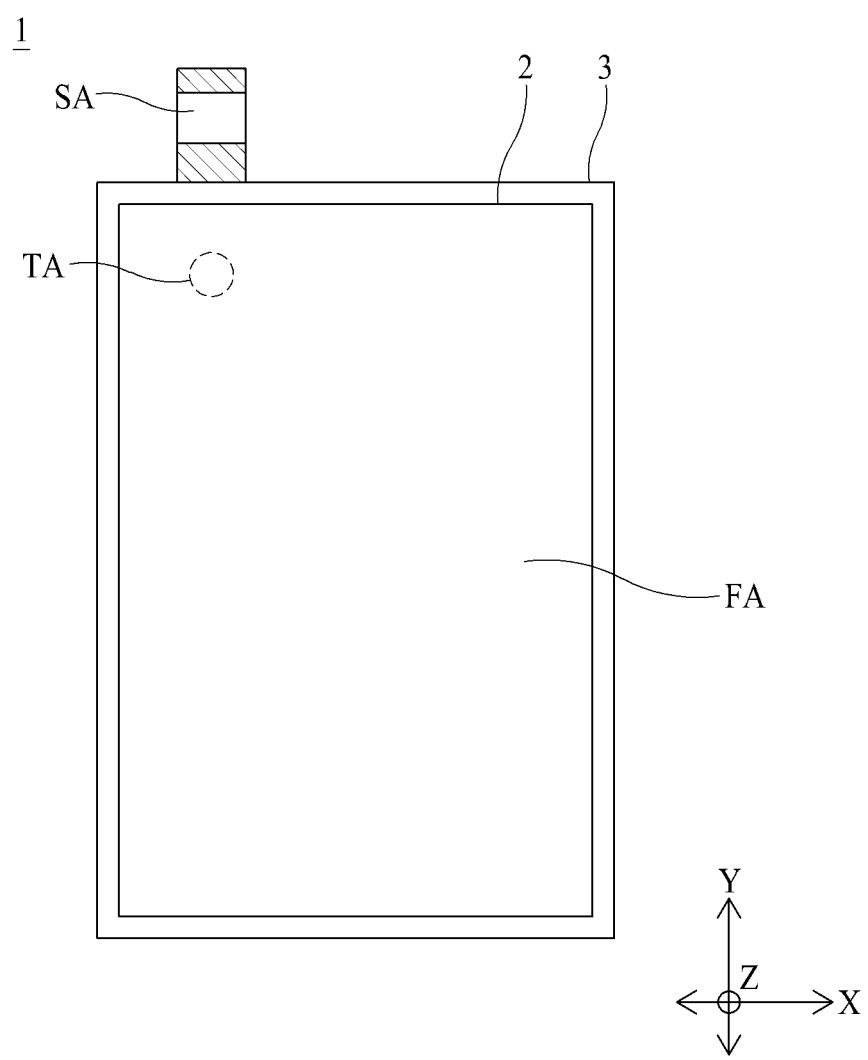
FIGS. 5A to 5D are front views illustrating various aspects when a plurality of transmissive areas are provided in FIG. 3.
Figure 5B:
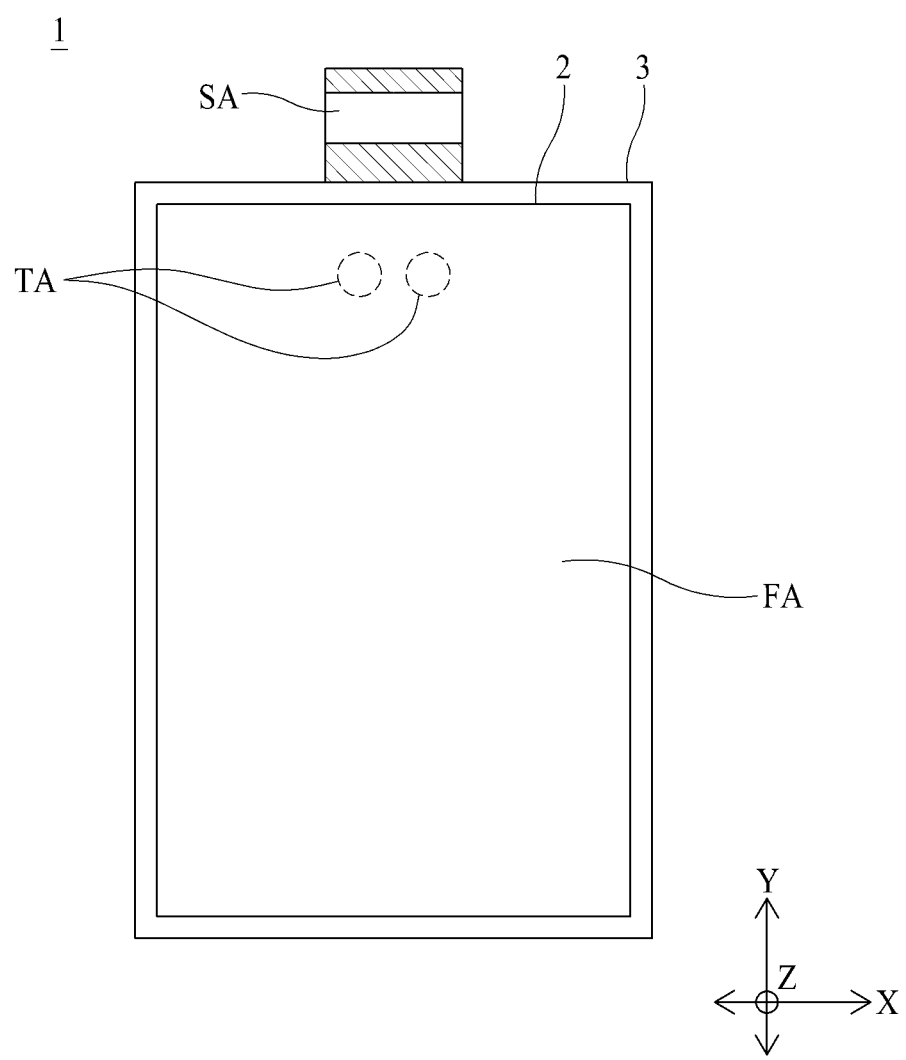
Figure 5C:
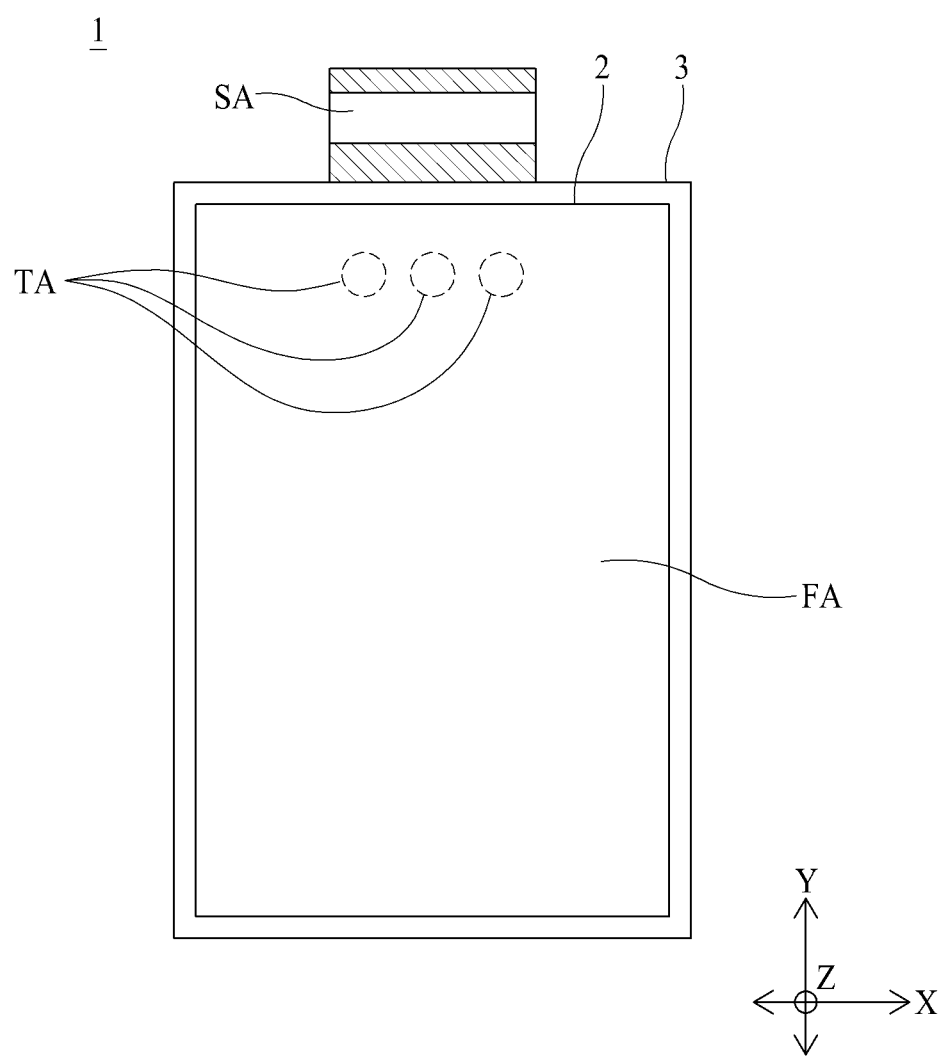
Figure 5D:
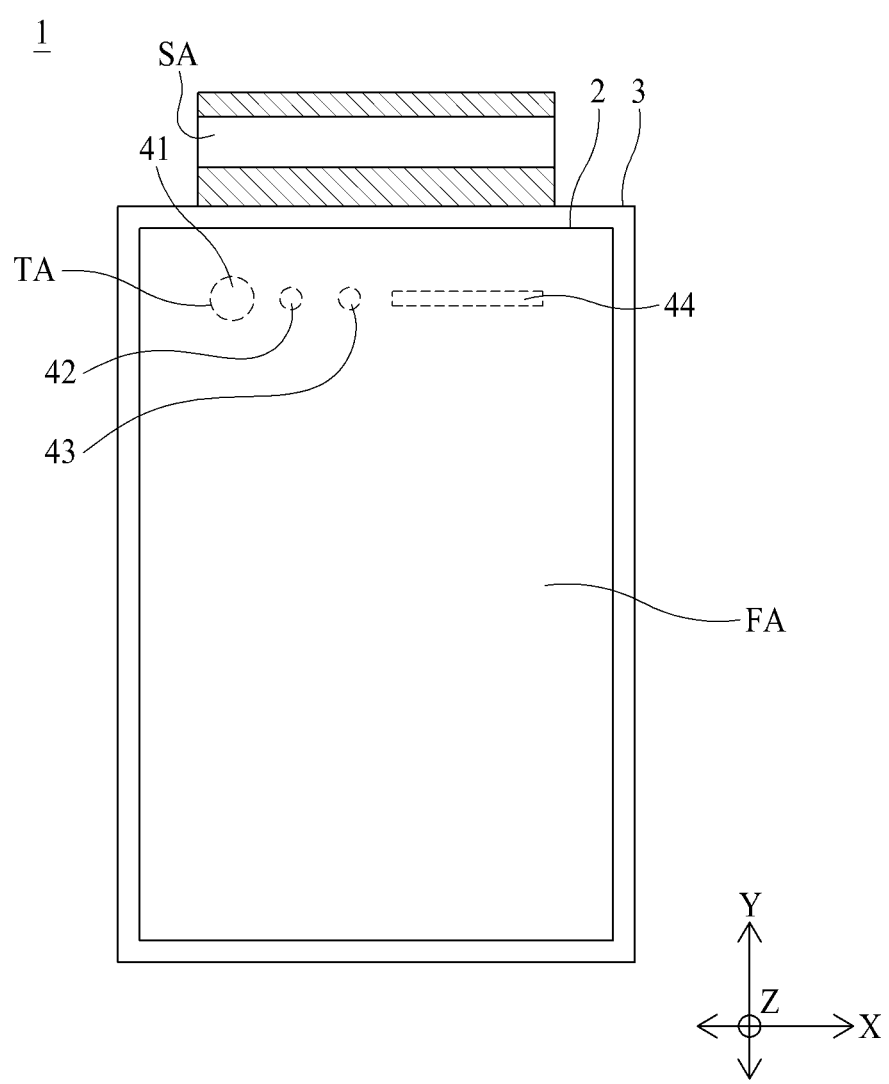

FIGS. 5A to 5D are brief front views when the side area SA is unfolded as shown in FIG. 3, wherein FIG. 5A illustrates one transmissive area TA, that is, one auxiliary member 4, FIG. 5B illustrates two transmissive areas TA, that is, two auxiliary members 4, and FIG. 5C illustrates three transmissive areas TA, that is, three auxiliary members 4. If the auxiliary member 4 is the camera 41, the number of the cameras 41 may be 1, 2 and 3, respectively in FIGS. 5A to 5C. If the number of the cameras 41 is 2 or more, the cameras 41 may have their respective lenses different from each other. The auxiliary member 4 may include, but is not limited to, the camera 41 only, and at least one or more of an illumination sensor 42, a proximity sensor 43 and a speaker 44 may be combined together with the camera 41 as shown in FIG. 5D. Also, as shown in FIG. 5D, the transmissive areas TA where the camera 41, the illumination sensor 42, the proximity sensor 43 and the speaker 44 are arranged may be provided at different sizes and shapes. The illumination sensor 42 is a sensor for sensing intensity of light, the proximity sensor 43 is a sensor for detecting a position of an object, and the speaker 44 is intended to convert an electric signal to sound waves.

If the transmissive area TA and the auxiliary member 4 are provide in a plural number, the size of the side area SA may be provided greatly to emit the image to each of the transmissive areas TA. In this case, since the transmissive areas TA are arranged in the front area FA at different positions, images emitted to each of the transmissive areas TA may be different images. However, without limitation to this example, images emitted from the side area SA to each of the transmissive areas TA may be the same images. In FIGS. 5A to 5D, although the side area SA is provided greatly by one display panel 2 to correspond to the transmissive areas TA, the plurality of side areas SA may be provided to be spaced apart from one another such that the side areas SA may be arranged in a position corresponding to each of the transmissive areas TA.

The semi-transmissive mirror 5 may be arranged between the transmissive areas TA and the auxiliary members 4. Only one semi-transmissive mirror 5 may be provided with a size different from that of the side area SA, or a plurality of semi-transmissive mirrors 5 may be provided to be spaced apart from one another. Therefore, the image light L2 emitted from the side area SA may be emitted to the transmissive areas TA through the semi-transmissive mirror 5.

Figure 6:
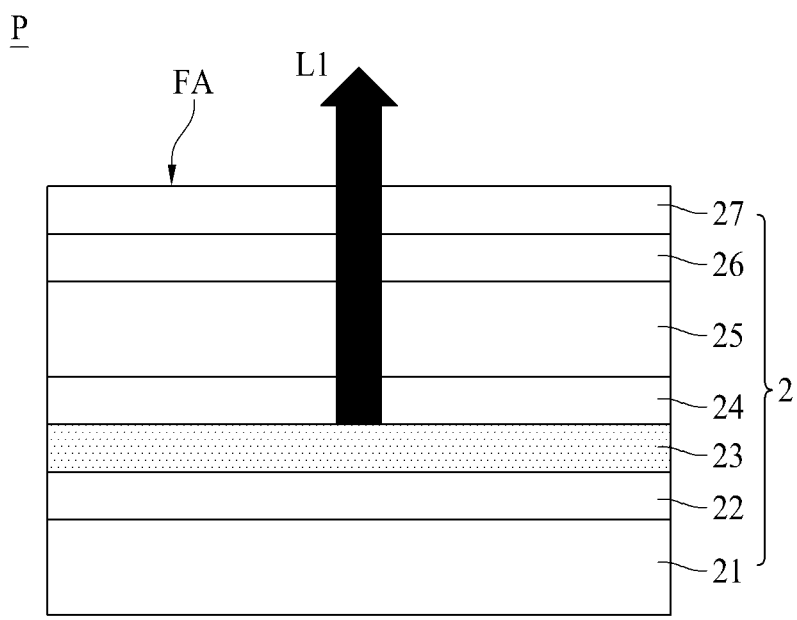
FIG. 6 is a brief enlarged view illustrating portion P shown in FIG. 2.
Figure 7:
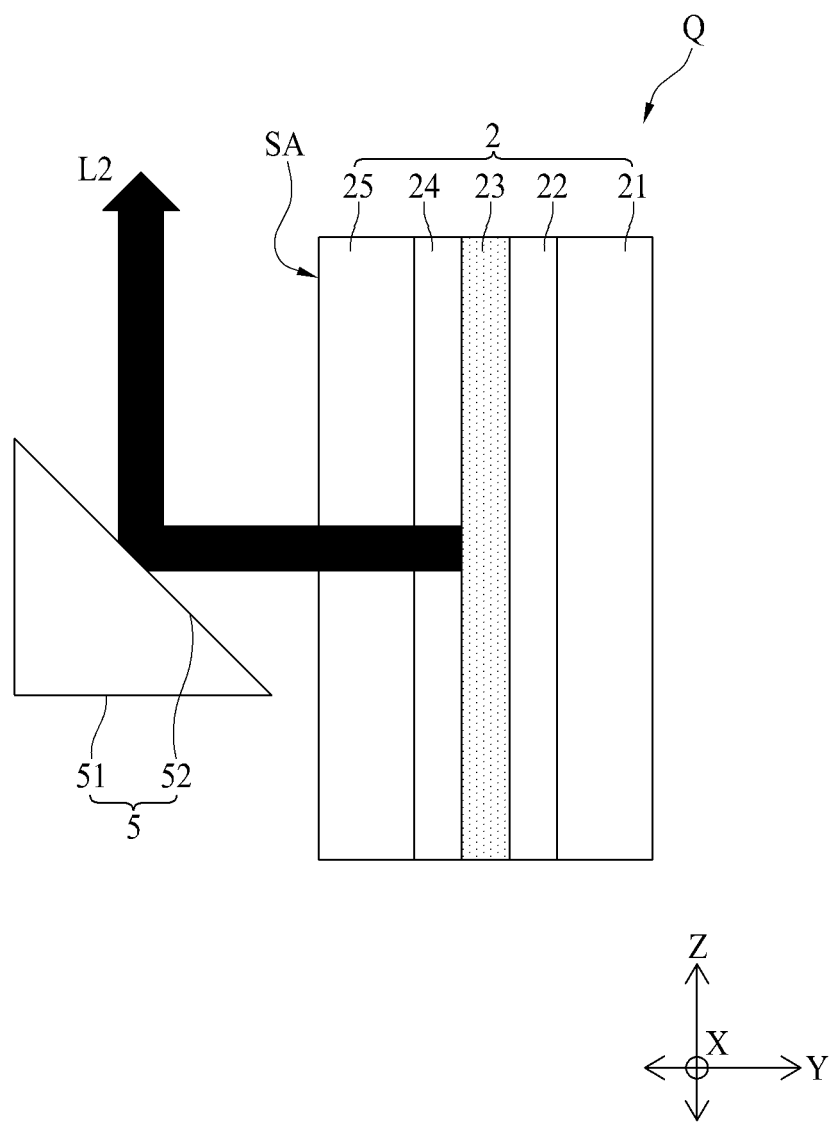
FIG. 7 is a brief enlarged view illustrating a portion Q and a semi-transmissive mirror shown in FIG. 2.
Figure 8B:
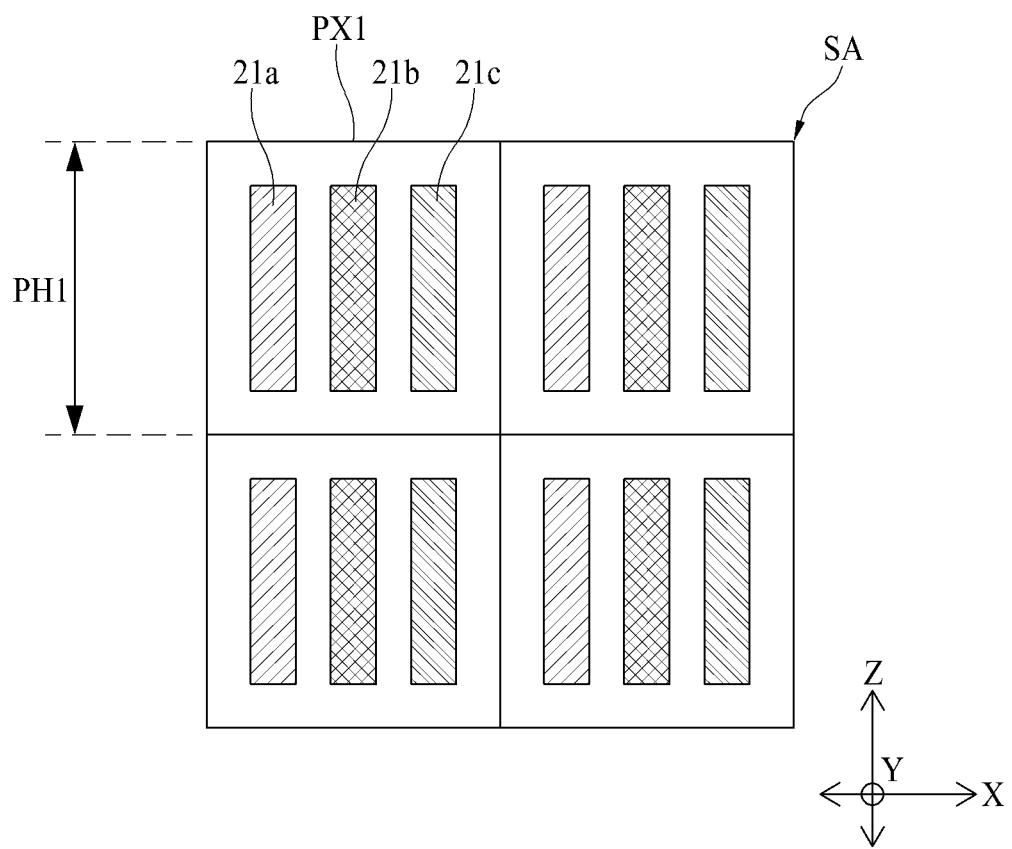
FIG. 8B is a brief view illustrating a pixel of a side area in FIG. 8A.

FIG. 6 is a brief enlarged view illustrating a portion P shown in FIG. 2, FIG. 7 is a brief enlarged view illustrating a portion Q and a semi-transmissive mirror shown in FIG. 2, FIG. 8A is a detailed view of FIG. 2, and FIG. 8B is a brief view illustrating a pixel of a side area in FIG. 8A.

Referring to FIG. 6, the front area FA except the transmissive area TA from the display panel 2 may include a substrate 21, an anode 22, a light emitting layer 23, a cathode 24, an encapsulation layer 25, a polarizer 26, and a cover glass 27.

The substrate 21 may be a semiconductor substrate such as plastic film, a glass substrate or silicon. The substrate 21 may be made of a transparent material or an opaque material. If the substrate 21 is arranged in the transmissive area TA, the substrate 21 may be made of a transparent material.

A plurality of subpixels P may be provided on the substrate 21. The substrate 21 according to one example may include a first subpixel 21a (shown in FIG. 8B) emitting red light, a second subpixel 21b (shown in FIG. 8B) emitting green light, and a third subpixel 21c (shown in FIG. 8B) emitting blue light. The first subpixel 21a, the second subpixel 21b and the third subpixel 21c may be arranged on the substrate 21 to adjoin one another. Each of the first subpixel 21a, the second subpixel 21b and the third subpixel 21c may be provided to include an anode 22, a light emitting layer 23, and a cathode 24.

The display apparatus 1 according to one aspect of the present disclosure is provided in a top emission mode in which light is emitted to an upper portion. Therefore, although an opaque material as well as a transparent material may be used as a material of the substrate 21, if the substrate 21 is arranged in the transmissive area TA as described above, the transparent material may be used. Although not shown, a separate reflective layer may be provided between the substrate 21 and the anode 22 in the other area except the transmissive area TA in the substrate 21 to reflect the light emitted from the light emitting layer 23 to the substrate 21 toward the upper portion.

A circuit element comprising a plurality of thin film transistors, various types of signal lines and a capacitor may be provided per each of the subpixels in the substrate 21. The signal lines may include gate lines, data lines, power lines and reference lines, and the thin film transistor (not shown) may include a switching thin film transistor, a driving thin film transistor, and a sensing thin film transistor. The subpixels are defined by an intersection structure of the gate lines and the data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line, and serves to supply the generated data current to the anode 22.

The sensing thin film transistor serves to sense a threshold voltage deviation of the driving thin film transistor, which is a cause of image quality degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first transistor, a second transistor and a third transistor are arranged for each of the subpixels 21a, 21b and 21c in the substrate 21. The first transistor according to one example may be connected to a first sub electrode arranged on the first subpixel 21a to apply a driving voltage for emitting light of a color corresponding to the first subpixel 21a.

The second transistor according to one example may be connected to a second sub electrode arranged on the second subpixel 21b to apply a driving voltage for emitting light of a color corresponding to the second subpixel 21b.

The third transistor according to one example may be connected to a third sub electrode arranged on the third subpixel 21c to apply a driving voltage for emitting light of a color corresponding to the third subpixel 21c.

Each of the first subpixel 21a, the second subpixel 21b and the third subpixel 21c according to one example supplies a predetermined current to the organic light emitting layer in accordance with the data voltage of the data line when a gate signal from the gate line is input thereto using each of the transistors. For this reason, the organic light emitting layer of each of the first subpixel 21a, the second subpixel 21b and the third subpixel 21c may emit light with a predetermined brightness in accordance with the predetermined current.

The anode 22 is formed on the substrate 21. The anode 22 according to one example may be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The anode 22 may include a first sub electrode provided in the first subpixel 21a, a second sub electrode provided in the second subpixel 21b and a third sub electrode provided in the third subpixel 21c.

The first sub electrode is formed on the substrate 21, and is connected to a source electrode of the first transistor through a contact hole passing through a portion of the substrate 21.

The second sub electrode is formed on the substrate 21, and is connected to a source electrode of the second transistor through a contact hole passing through a portion of the substrate 21.

The third sub electrode is formed on the substrate 21, and is connected to a source electrode of the third transistor through a contact hole passing through a portion of the substrate 21.

In this case, the first to third transistors may be N-type TFTs.

If the first to third transistors are provided as P-type TFTs, each of the first to third sub electrodes may be connected to a drain electrode of each of the first to third transistors.

That is, each of the first to third sub electrodes may be connected to a source electrode or a drain electrode in accordance with types of the first to third transistors.

The display apparatus 1 according to one aspect of the present disclosure may further comprise a plurality of banks (not shown) for partitioning the first subpixel 21a, the second subpixel 21b and the third subpixel 21c from one another.

The bank may be provided to cover edges of the first sub electrode, the second sub electrode and the third sub electrode, thereby partitioning the first subpixel 21a, the second subpixel 21b and the third subpixel 21c from one another. The bank serves to define the subpixels, that is, a light emitting portion. Also, since an area where the bank is formed does not emit light, the area may be defined as a non-light emitting portion. The bank may be formed of an organic film such as acryl resin, epoxy resin, phenolic resin, polyamide resin, and polyimide resin.

The light emitting layer 23 is arranged on the anode 22. The light emitting layer 23 according to one example may include a hole transporting layer HTL, a light emitting layer EML, a hole blocking layer HBL, and an electron transporting layer ETL. The light emitting layer 23 may further include a hole injecting layer HIL, an electron blocking layer EBL, and an electron injecting layer EIL.

The hole injecting layer HIL, the hole transporting layer HTL, the electron transporting layer ETL, and the electron injecting layer EIL of the light emitting layer 23 are intended to improve emission efficiency of the light emitting layer EML. The hole transporting layer HTL and the electron transporting layer ETL are intended for balance of electrons and holes. The hole injecting layer HIL and the electron injecting layer EIL are intended to enhance injection of electrons and holes.

In more detail, the hole injecting layer HIL may facilitate hole injection by lowering injection energy barrier of holes injected from an anode material. The hole transporting layer HTL serves to transport holes injected from an anode to the light emitting layer without loss.

The light emitting layer EML is a layer for emitting light through recombination of holes injected from an anode and electrons injected from a cathode, and may emit light of red, blue and green colors in accordance with combination energy inside the light emitting layer and form a white light emitting layer by configuring a plurality of light emitting layers. The hole blocking layer HBL may be provided between the light emitting layer EML and the electron transporting layer ETL to block movement of holes which are not combined with electrons in the light emitting layer EML. The electron blocking layer EBL is provided between the light emitting layer EML and the hole transporting layer HTL and serves to trap electrons in the light emitting layer EML to allow the electrons not to move from the light emitting layer EML to the hole transporting layer HTL.

The electron transporting layer ETL serves to transport the electrons injected from the cathode to the light emitting layer. The electron injecting layer EIL serves to facilitate injection of the electrons from the cathode by lowering a potential barrier during injection of the electrons.

If a high potential voltage is applied to the anode 22 and a low potential voltage is applied to the cathode 24, holes and electrons are moved to the light emitting layer 23 through the hole transporting layer and the electron transporting layer, respectively and combined with each other in the light emitting layer 23 to emit light.

The light emitting layer 23 may include a first organic light emitting layer provided on the first sub electrode, a second organic light emitting layer provided on the second sub electrode, and a third organic light emitting layer provided on the third sub electrode. The first organic light emitting layer, the second organic light emitting layer and the third organic light emitting layer may be provided in one pixel. In this case, one pixel may mean, but is not limited to, one pixel capable of embodying white light by combination of red light, green light and blue light.

As described above, each of the first to third organic light emitting layers may include a hole injecting layer, a hole transporting layer, an electron blocking layer, a light emitting layer, a hole blocking layer, an electron transporting layer, and an electron injecting layer.

Meanwhile, if the first organic light emitting layer, the second organic light emitting layer and the third organic light emitting layer are provided to emit red (R) light, green (G) light and blue (B) light, an arrangement sequence of the first to third organic light emitting layers for the first to third sub electrodes may be combined in various ways. As the first organic light emitting layer, the second organic light emitting layer and the third organic light emitting layer emit red (R) light, green (G) light and blue (B) light, the display apparatus 1 according to one aspect of the present disclosure may not use a color filter, whereby the manufacturing cost may be reduced as compared with the case that a color filter is used. However, without limitation to this example, the display apparatus 1 according to one aspect of the present disclosure may be provided to emit light of different colors per subpixel as a white light emitting layer is provided as a common layer and different color filters are arranged per subpixel.

The cathode 24 is arranged on the light emitting layer 23. The cathode 24 according to one example is a common layer commonly formed in the first subpixel 21a, the second subpixel 21b and the third subpixel 21c. The cathode 24 may be formed of a transparent conductive material (TCO) such as ITO and IZO, which can transmit light, or may be formed of a semi-transmissive conductive material such as Mg, Ag, or Alloy of Mg and Ag.

Referring to FIG. 6 again, the encapsulation layer 25 may be formed on the cathode 24. The encapsulation layer 25 serves to prevent oxygen or water from being permeated into the light emitting layer 23 and the cathode 24. To this end, the encapsulation layer 25 may include at least one inorganic film and at least one organic film.

For example, the encapsulation layer 25 may include a first inorganic film, an organic film, and a second inorganic film. In this case, the first inorganic film is formed to cover the cathode 24. The organic film is formed to cover the first inorganic film. The organic film may be formed at a length long enough to prevent particles from being permeated into the light emitting layer 23 and the cathode 24 by passing through the first inorganic film. The second inorganic film is formed to cover the organic film.

The polarizer 26 is intended to prevent the external light L3 from entering a user's eyes after being reflected in a metal material such as the cathode 24. Therefore, the polarizer 26 may be arranged in the front area FA except the transmissive area TA or the front area FA where the cathode 24 is arranged. Referring to FIG. 7, although the cathode 24 is arranged even in the side area SA, since the side area SA is arranged inside the main body 3, the external light L3 fails to enter the side area SA. Therefore, the polarizer 26 may not be arranged in the side area SA.

The polarizer 26 may prevent reflection of the external light L3 but may reduce transmittance of the image light L2 emitted from the light emitting layer 23 and then emitted to the upper portion. For example, if luminance of the image light L1 emitted from the light emitting layer 23 arranged in the front area FA is 100, luminance of the image light L1 emitted after being transmitted from the polarizer 26 may be about 50. That is, luminance of the image light L1 emitted from the front area FA may be about 50. Therefore, the polarizer 26 may not be arranged in the transmissive area TA.

The cover glass 27 is intended to protect the encapsulation layer 25, the cathode 24, the light emitting layer 23, the anode 22 and the substrate 21, which are arranged below the polarizer 26, and the polarizer 26 so as not to be damaged from particles such as water and dust and external impact. The cover glass 27 may be arranged on the polarizer 26. However, since the polarizer 26 is not disposed in the transmissive area TA, only the cover glass 27 may be disposed in the transmissive area TA. Since the cover glass 27 is finally arranged after the side area SA is arranged inside the main body 3, the cover glass 27 may be arranged on the transmissive area TA and the front area FA except the transmissive area TA, that is, the polarizer 26. Also, since the cover glass 27 is finally arranged after the side area SA is arranged inside the main body 3, the cover glass 27 may not be arranged in the side area SA.

In summary, since the side area SA is arranged inside the main body 3, the external light L3 fails to enter the side area SA, whereby the polarizer 26 and the cover glass 27 may not be arranged as shown in FIG. 7. Therefore, since the image light L2 emitted from the side area SA does not pass through the polarizer 26, luminance of the image light L2 may be about 100. However, since 50% of the image light L2 emitted from the side area SA may be reflected in the semi-transmissive mirror 5 and then emitted to the transmissive area TA, luminance of the image light L2 emitted from the transmissive area TA may be about 50.

Consequently, in the display apparatus 1 according to one aspect of the present disclosure, luminance of the image light L1 emitted from the front area FA except the transmissive area TA may be about 50 due to the polarizer 26 and luminance of the image light L2 emitted from the transmissive area TA may be about 50 due to the semi-transmissive mirror 5. Therefore, a user may view images having no sense of difference between luminance of the image light L1 emitted from the front area FA and luminance of the image light L2 emitted from the transmissive area TA.

Referring to FIGS. 8A and 8B, in the display apparatus 1 according to one aspect of the present disclosure, the semi-transmissive mirror 5 may be provided to be arranged below the substrate 21. In this case, the case that the semi-transmissive mirror 5 is arranged below the substrate 21 may mean that the semi-transmissive mirror 5 is not overlapped with a side of the substrate 21 in Z axis direction. The semi-transmissive mirror 5, as shown in FIG. 8, may be provided to have a section of a trapezoid. The inclined surface 52 may be arranged below the transmissive area TA. The flat surface 51 may be arranged below the transmissive area TA and below the substrate 21. However, without limitation to this case, the semi-transmissive mirror 5 may be provided to have a section of a triangle as shown in FIG. 2 and arranged below a right side of the substrate 21. In this case, the inclined surface 52 and the flat surface 51 of the semi-transmissive mirror 5 may be arranged below the transmissive area TA.

The reason why that the semi-transmissive mirror 5 is arranged below the substrate 21 is that the transmissive area TA may be spaced apart from the main body 3 at a predetermined distance. Therefore, the transmissive area TA may be arranged anywhere in the other area except the end portion of the front area FA. That is, degree of freedom for arrangement position of the transmissive area TA may be enhanced. A detailed description regarding this case will be given again in the description of the display apparatus 1 according to the second aspect of the present disclosure.

Meanwhile, the display apparatus 1 according to the second aspect of the present disclosure may further comprise a back plate BP.

Figure 10:
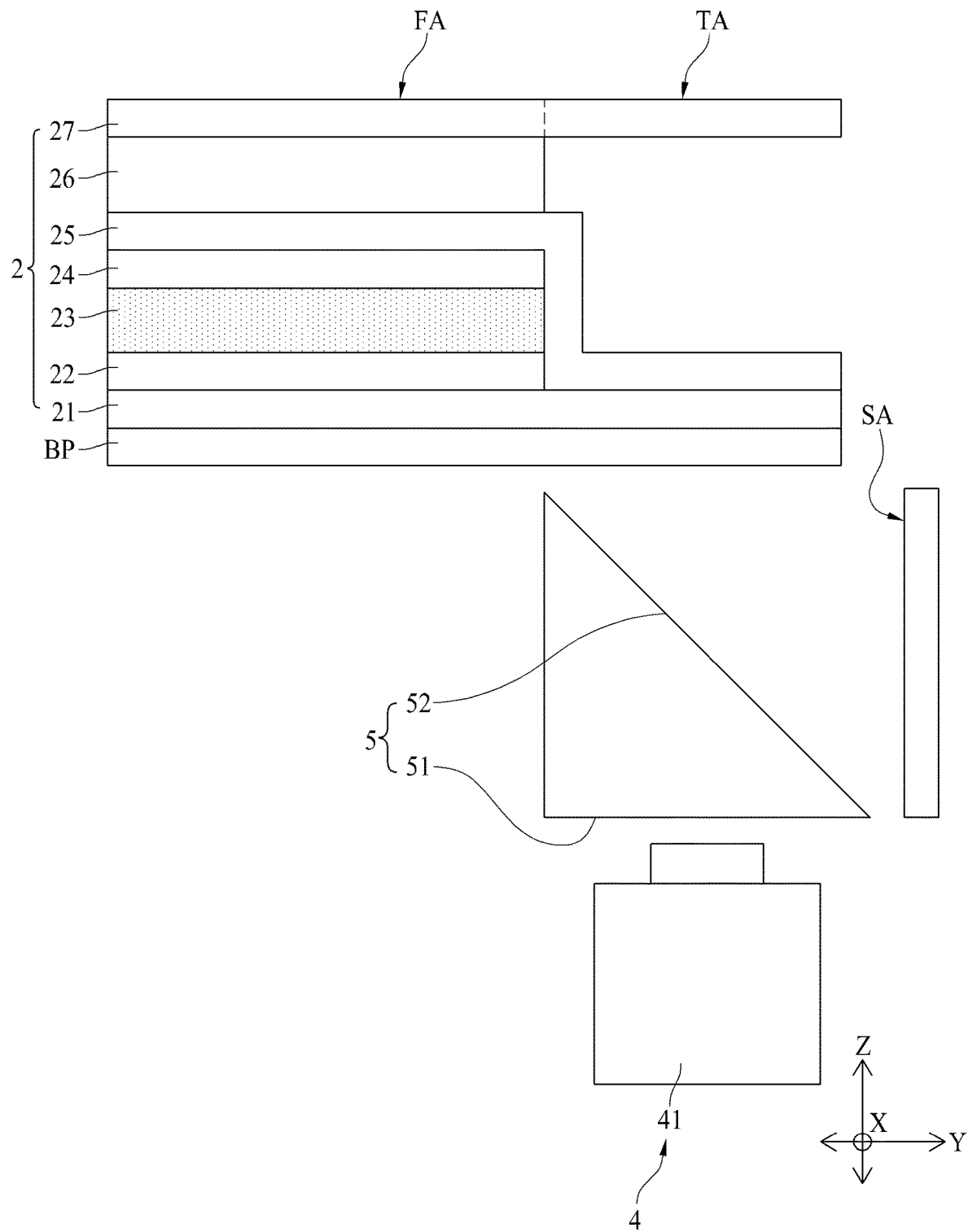
FIG. 10 is a brief cross-sectional view illustrating a display apparatus according to the third aspect of the present disclosure.

Referring to FIG. 8A, the back plate BP may be arranged between the substrate 21 and the semi-transmissive mirror 5. The back plate BP is intended to support the display panel 2 such that the display panel 2 may not be recessed inside the main body 3. The back plate BP may be provided at the same size as that of the display panel 2 arranged in the front area FA except the transmissive area TA and then coupled to the lower surface of the substrate 21 by an adhesive member. The back plate BP may be made of a metal material or plastic material and coupled to the main body 3. The back plate BP may be supported in the main body 3 to support the display panel 2. The back plate BP may be arranged so as not to overlap the inclined surface 52 of the semi-transmissive mirror 5, whereby the back plate BP may not interfere with the image light L2 of the side area SA, which is reflected in the inclined surface 52 and emitted toward the transmissive area TA. Also, the back plate BP may be arranged so as not to overlap the inclined surface 52 of the semi-transmissive mirror 5, whereby the external light L3 that has transmitted through the transmissive area TA may reach the auxiliary member 4 through the inclined surface 52 without interference. However, if the back plate BP is made of a transparent material, the back plate BP may be arranged even in the transmissive area TA as shown in FIG. 10.

In the display apparatus 1 according to the second aspect of the present disclosure, as shown in FIG. 8A, the cover glass 27 may only be arranged in the transmissive area TA. That is, among the elements constituting the display panel 2, the other elements except the cover glass 27, that is, the substrate 21, the anode 22, the light emitting layer 23, the cathode 24, the encapsulation layer 25 and the polarizer 26 may not be arranged in the transmissive area TA. This is to allow the image light L2 emitted from the side area SA and then reflected in the inclined surface 52 of the semi-transmissive mirror 5 to be transmitted to the transmissive area TA without interference with the other elements of the display panel 2 except the cover glass 27. Therefore, luminance of the image light L2 emitted through the transmissive area TA may be increased.

Also, since the other elements of the display panel 2 except the cover glass 27 are not arranged in the transmissive area TA, the external light L3 entering through the transmissive area TA may enter the auxiliary member 4 without interference of the other elements of the display panel 2. Therefore, luminance of the external light L3 sensed by the auxiliary member 4 may be increased.

Meanwhile, the inclined surface 52 of the semi-transmissive mirror 5 may be provided to have a certain angle with respect to the flat surface 51.

Since heights of the side area SA and the semi-transmissive mirror 5 are changed depending on an angle formed by the inclined surface 52 and the flat surface 51 as shown in FIG. 3, the angle formed by the inclined surface 52 and the flat surface 51 may be a factor that determines a size of the pixel of the side area SA.

The aspects of the display apparatus 1 according to the present disclosure may be categorized in accordance with the angle formed by the inclined surface 52 and the flat surface 51.

First of all, the display apparatus 1 according to the present disclosure may be provided such that the inclined surface 52 is arranged at a second angle $\theta 2$ with respect to the flat surface 51. For example, the second angle $\theta 2$ may be 45°. If the second angle $\theta 2$ is 45°, since a section of the semi-transmissive mirror 5 becomes an isosceles triangle, a width of the flat surface 51 arranged in the transmissive area TA may be equal to a height of the inclined surface 52. The width of the flat surface 51 arranged in the transmissive area TA may be equal to the width of the transmissive area TA, and the height of the inclined surface 52 may be equal to the height of the side area SA. Consequently, if the second angle $\theta 2$ is 45°, the width of the transmissive area TA, the width of the flat surface 51 arranged in the transmissive area TA, the height of the inclined surface 52 and the height of the side area SA may be provided equally to one another.

FIG. 8B briefly illustrates a portion of pixels arranged in the side area SA when the second angle θ2 is 45° as shown in FIG. 8A. As shown in FIG. 8B, one pixel PX1 may include a first subpixel 21a emitting red light, a second subpixel 21b emitting green light, and a third subpixel 21c emitting blue light. As described above, if the second angle θ2 is 45°, since the height of the inclined surface 52 is equal to the height of the side area SA, one PX1 of the plurality of pixels PX1 may have a first height PH1. The first pixel PH1 of the pixel PX1 may mean a length of the pixel PX1 based on a direction parallel with Z axis direction.

Although the above description is based on that the second angle θ2 is 45°, the second angle θ2 may be provided at an angle greater than 45° and smaller than 90°. This is because that the image light L2 emitted from the side area SA cannot be emitted to the transmissive area TA after being reflected in the inclined surface 52 if the second angle θ2 is 90°.

Meanwhile, if the second angle θ2 is greater than 45°, the first height PH1 of one pixel PX1 arranged in the side area SA may become greater. If the first height PH1 of one pixel PX1 becomes greater, the number of the pixels PX1, which may be emitted to the transmissive area TA through the semi-transmissive mirror 5, is reduced, whereby resolution may be lowered.

Consequently, in the display apparatus 1 according to one aspect of the present disclosure, the second angle θ2 may be provided to be greater than 45° and less than 90°, and may be provided at an angle of 45° such that resolution may not be lowered.

Figure 9B:
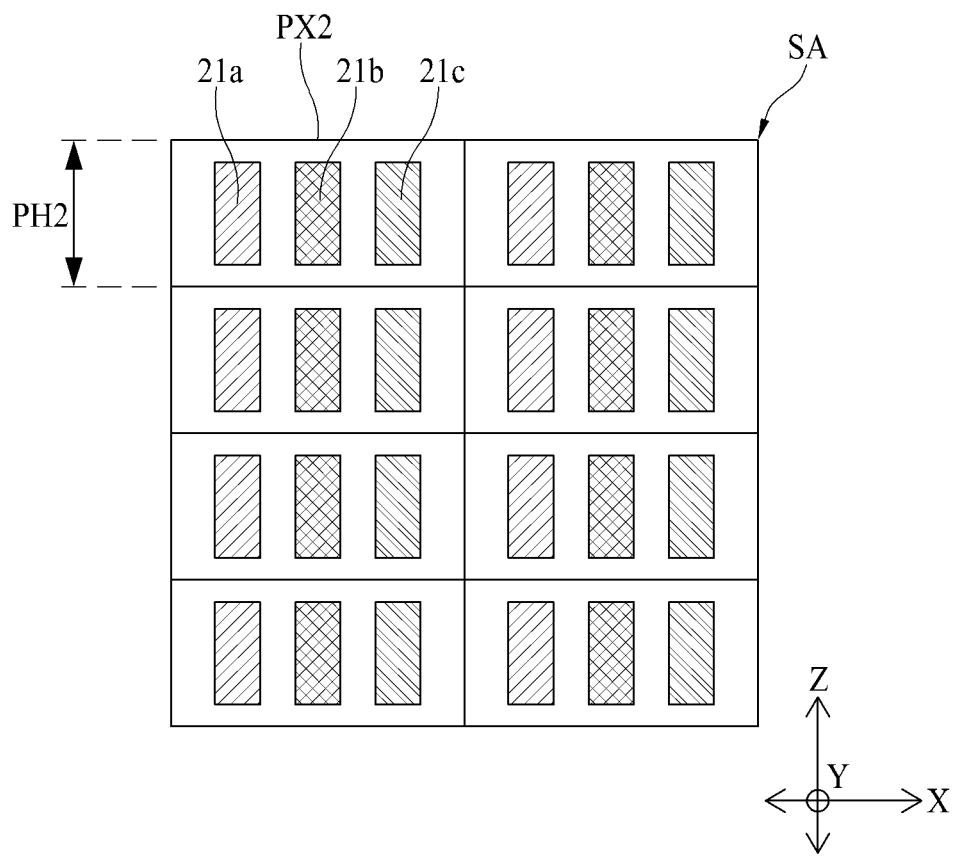
FIG. 9B is a brief view illustrating a pixel of a side area in FIG. 9A.

FIG. 9A is a brief cross-sectional view illustrating a display apparatus according to the second aspect of the present disclosure, and FIG. 9B is a brief view illustrating a pixel of a side area in FIG. 9A.

Referring to FIGS. 9A and 9B, the display apparatus 1 according to the second aspect of the present disclosure is the same as the display apparatus according to FIG. 2 except that the angle formed by the inclined surface 52 and the flat surface 51 of the semi-transmissive mirror 5 is provided to be smaller than the second angle θ2. Therefore, the same reference numerals will be given to the same elements, and different elements will be described hereinafter.

In case of the display apparatus according to FIG. 2, the inclined surface 52 and the flat surface 51 are provided at 45° of the second angle θ2, whereby the width of the transmissive area TA, the width of the flat surface 51 arranged in the transmissive area TA, the height of the inclined surface 52 and the height of the side area SA may be provided equally to one another. In this case, one PX1 of the plurality of pixels PX1 arranged in the side area SA may have a first height PH1. Also, in this, case, an aspect ratio of the pixel PX1 may be 1:1.

On the other hand, in case of the display apparatus according to the second aspect of FIG. 9A, the inclined surface 52 may be provided to be arranged at a third angle θ3, which is smaller than the second angle θ2, with respect to the flat surface 51. For example, the third angle θ3 may be greater than 20° and less than 45°. If the third angle θ3 is less than 45°, a section of the semi-transmissive mirror 5 may not be an isosceles triangle but be a triangle where the width of the flat surface 51 arranged in the transmissive area TA is longer than the height of the inclined surface 52. Therefore, the height of the inclined surface 52 shown in FIG. 9A may be provided to be lower than the height of the inclined surface 52 shown in FIG. 8A. In this case, the height of the side area SA facing the inclined surface 52 may be lowered. Therefore, as shown in FIG. 9B, one pixel PX2 of a plurality of pixels PX2 may have a second height PH2 lower than the first height PH1 of the pixel PX1 shown in FIG. 8B. This may mean that the second height PH2 of the pixel PX2 shown in FIG. 9B should be lowered to emit the same image to the transmissive area TA because the height of the side area SA according to FIG. 9A is lower than the height of the side area SA according to FIG. 8A. Therefore, as shown in FIG. 9B, one pixel PX2 may be provided to have a horizontal length longer than a vertical length. That is, in the display apparatus according to FIG. 9A, the size of the pixel is smaller than that of the display apparatus according to FIG. 8A in a vertical direction, whereby more pixels may be arranged in a vertical direction and therefore higher resolution may be embodied in a vertical direction.

In the display apparatus 1 according to the second aspect of the present disclosure, as the inclined surface 52 may be provided to be arranged at the third angle θ3 with respect to the flat surface 51, the height of the inclined surface 52 of the semi-transmissive mirror 5 may be reduced, whereby the whole thickness may be reduced.

However, if the third angle θ3 is smaller than 20°, since the thickness of the semi-transmissive mirror 5 is too thin, the semi-transmissive mirror 5 arranged in the transmissive area TA or the semi-transmissive mirror 5 arranged in the front area FA may easily be broken or damaged even in case of light impact.

Consequently, in the display apparatus 1 according to the second aspect of the present disclosure, the third angle θ3 is provided to be more than 20° and less than 45°, whereby high resolution may be embodied and the semi-transmissive mirror 5 may be prevented from being damaged.

FIG. 10 is a brief cross-sectional view illustrating a display apparatus according to the third aspect of the present disclosure.

Referring to FIG. 10, the display apparatus 1 according to the third aspect of the present disclosure is the same as the display apparatus according to FIG. 2 except the elements arranged in the transmissive area TA. Therefore, the same reference numerals will be given to the same elements, and different elements will be described hereinafter.

In case of the display apparatus according to FIG. 2, since only the cover glass 27 is arranged in the transmissive area TA, the other elements except the cover glass 27, that is, the substrate 21, the anode 22, the light emitting layer 23, the cathode 24, the encapsulation layer 25 and the polarizer 26 are not arranged in the transmissive area TA, whereby interference between the image light L2 and the external light L1 may be avoided. In more detail, in case of the display apparatus according to FIG. 2, since no elements of the display panel 2 are arranged between the semi-transmissive mirror 5 and the cover glass 27 arranged in the transmissive area TA, the image light L2 emitted from the side area SA and reflected in the inclined surface 52 of the semi-transmissive mirror 5 may be transmitted through the cover glass 27 arranged in the transmissive area TA without any interference. Therefore, luminance of the image light L2 emitted through the transmissive area TA may be increased.

Also, the other elements of the display panel 2 except the cover glass 27 are not arranged in the transmissive area TA, whereby the external light entering through the transmissive area TA may enter the auxiliary member 4 without interference of the other elements of the display panel 2. Therefore, luminance of the external light sensed by the auxiliary member 4 may be increased.

However, in case of the display apparatus according to FIG. 2, since the other elements of the display panel 2 except the cover glass 27 should be removed from the transmissive area TA, a separate removal process using laser is additionally required. Since a portion of the display panel 2 removed by the laser process, that is, sections of the display panel 2 adjacent to the transmissive area TA may be exposed to the air, lifetime of the anode 22, the light emitting layer 23 and the cathode 24 may be reduced.

On the other hand, in case of the display apparatus 1 according to the third aspect of FIG. 10, the light emitting layer 23, the cathode 24 and the polarizer 26 may not be arranged in the transmissive area TA. That is, elements which have opaque colors, form an electric field or lower transmittance may not be arranged in the transmissive area TA. Therefore, in case of the display apparatus 1 according to the third aspect of FIG. 10, the back plate BP made of a transparent material and the substrate 21, the encapsulation layer 25 and the cover glass 27, which are made of a transparent material, may be arranged in the transmissive area TA.

Since the back plate BP is transparent and may support the display panel 2, the back plate BP may be arranged in the transmissive area TA. Since the substrate 21 and the encapsulation layer 25 are transparent, the substrate 21 and the encapsulation layer 25 may be arranged in the transmissive area TA. Also, in case of the display apparatus 1 according to the third aspect of FIG. 10, since the anode 22, the light emitting layer 23, and the cathode 24, which are arranged in the transmissive area TA, may be removed by patterning in a vacuum state of forming the display panel 2, the anode 22, the light emitting layer 23 and the cathode 24 may be prevented from being exposed to the air. Therefore, in the display apparatus 1 according to the third aspect of the present disclosure, lifetime of the anode 22, the light emitting layer 23 and the cathode 24, that is, useful lifetime of the display panel 2 may be more increased than the case that a removal process is performed in a state that the anode 22, the light emitting layer 23 and the cathode 24 are exposed to the air.

Figure 11:
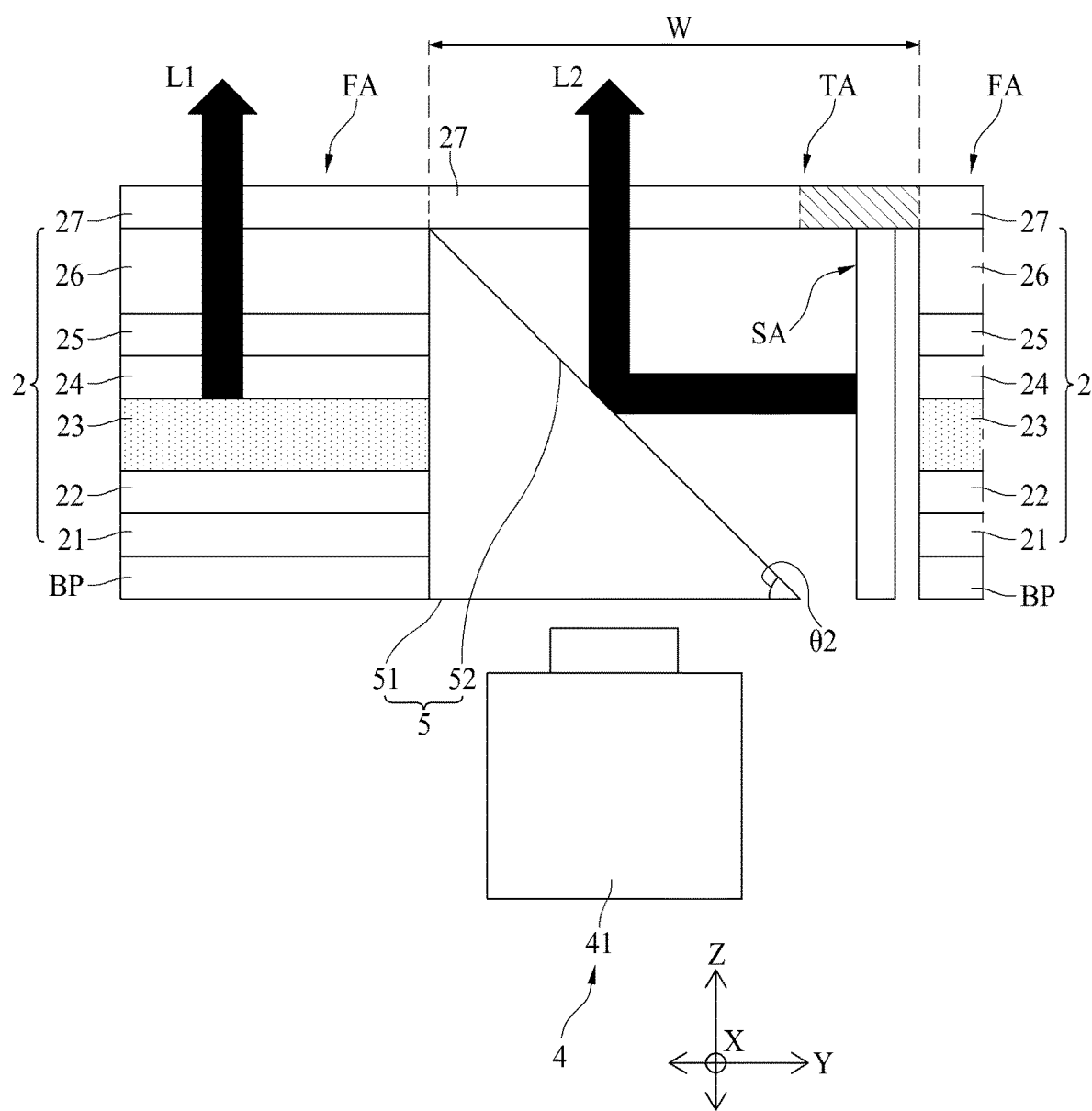
FIG. 11 is a brief cross-sectional view illustrating a display apparatus according to the fourth aspect of the present disclosure.

FIG. 11 is a brief cross-sectional view illustrating a display apparatus according to the fourth aspect of the present disclosure.

Referring to FIG. 11, the display apparatus 1 according to the fourth aspect of the present disclosure is the same as the display apparatus according to FIG. 2 except that the semi-transmissive mirror 5 is arranged at a side of each of the substrate 21, the anode 22, the light emitting layer 23, the cathode 24, the encapsulation layer 25 and the polarizer 26 and a size of the transmissive area TA is provided to be greater than that of the display apparatus according to FIG. 2. Therefore, the same reference numerals will be given to the same elements, and different elements will be described hereinafter.

In case of the display apparatus according to FIG. 2, since the semi-transmissive mirror 5 is provided to be arranged below the substrate 21, the transmissive area TA may be spaced apart from the main body 3 at a predetermined distance. Therefore, in case of the display apparatus according to FIG. 2, the transmissive area TA may freely be arranged in the other area except the end portion of the front area FA. That is, degree of freedom for the arrangement position of the transmissive area TA in the front area SA may be enhanced.

On the other hand, in case of the display apparatus 1 according to the fourth aspect of the present disclosure, since the semi-transmissive mirror 5 is arranged at a side of each of the substrate 21, the anode 22, the light emitting layer 23, the cathode 24, the encapsulation layer 25 and the polarizer 26, the transmissive area TA may be arranged at a side of the side area SA to face the semi-transmissive mirror 5. That is, in case of the display apparatus 1 according to the fourth aspect of the present disclosure, the semi-transmissive mirror 5 may be inserted into the transmissive area TA. Therefore, as shown in FIG. 11, the other elements of the display panel 2 except the cover glass 27, the semi-transmissive mirror 5 and the side area SA may sequentially be arranged in a direction parallel with Y axis direction.

Therefore, in case of the display apparatus 1 according to the fourth aspect of the present disclosure, since the semi-transmissive mirror 5 may be arranged to be closer to the cover glass 27 arranged in the transmissive area TA, the whole thickness may be more reduced than the case that the semi-transmissive mirror 5 is arranged below the substrate 21.

In case of the display apparatus 1 according to the fourth aspect of the present disclosure, since the semi-transmissive mirror 5 is arranged at the side of each of the substrate 21, the anode 22, the light emitting layer 23, the cathode 24, the encapsulation layer 25 and the polarizer 26, the cover glass 27 may only be arranged in the transmissive area TA. Therefore, since there is no element interfered between the cover glass 27 and the semi-transmissive mirror 5, luminance of the image light L2 emitted to the transmissive area TA may be improved, and the external light L3 having improved luminance may enter the auxiliary member 4.

Meanwhile, in the display apparatus 1 according to the fourth aspect of the present disclosure, as shown in FIG. 11, since the side area SA should be arranged to face the semi-transmissive mirror 5, the side area SA may be arranged to be close to the cover glass 27. Therefore, in the display apparatus 1 according to the fourth aspect of the present disclosure, a size W (shown in FIG. 11) of the transmissive area TA may be provided to be greater than the size of the transmissive area TA of the display apparatus according to FIG. 2, and the cover glass 27 arranged above the side area SA may be provided opaquely. This is because that part of the image light emitted from the side area SA may directly be emitted to a user toward the transparent cover glass 27 arranged above the side area SA without passing through the semi-transmissive mirror 5 if the cover glass 27 arranged above the side area SA is provided transparently. In this case, the image light having luminance of 50% emitted through the semi-transmissive mirror 5 and the image light having luminance of 100% emitted from the side area SA may be seen to a user, whereby a problem may occur in that the user has sensor of difference. Therefore, the cover glass 27 arranged in the transmissive area TA may partially be provided opaquely. In more detail, the cover glass 27 which is not overlapped with the semi-transmissive mirror 5 may opaquely be provided in the transmissive area TA.

Also, in the display apparatus 1 according to the fourth aspect of the present disclosure, as shown in FIG. 11, in order that the side area SA of the display panel 2 should be arranged to face the semi-transmissive mirror 5, since the side area SA of the display panel 2 should be inserted into a space formed between the semi-transmissive mirror 5 and the front area FA of the display panel 2, the size W of the transmissive area TA of the display apparatus according to FIG. 11 may be provided to be greater than the size of the transmissive area TA of the display apparatus according to FIG. 2.

Consequently, in the display apparatus 1 according to the fourth aspect of the present disclosure, the cover glass 27 arranged above the side area SA without being overlapped with the semi-transmissive mirror 5 may be provided opaquely, whereby images having no sense of difference may be provided to a user and the whole thickness may be reduced.

In the above description, although the cover glass 27 arranged above the side area SA is provided opaquely, without limitation to this example, the cover glass 27 may be provided transparently and the main body 3 may be provided to cover the cover glass 27 arranged above the side area SA.

Figure 12:
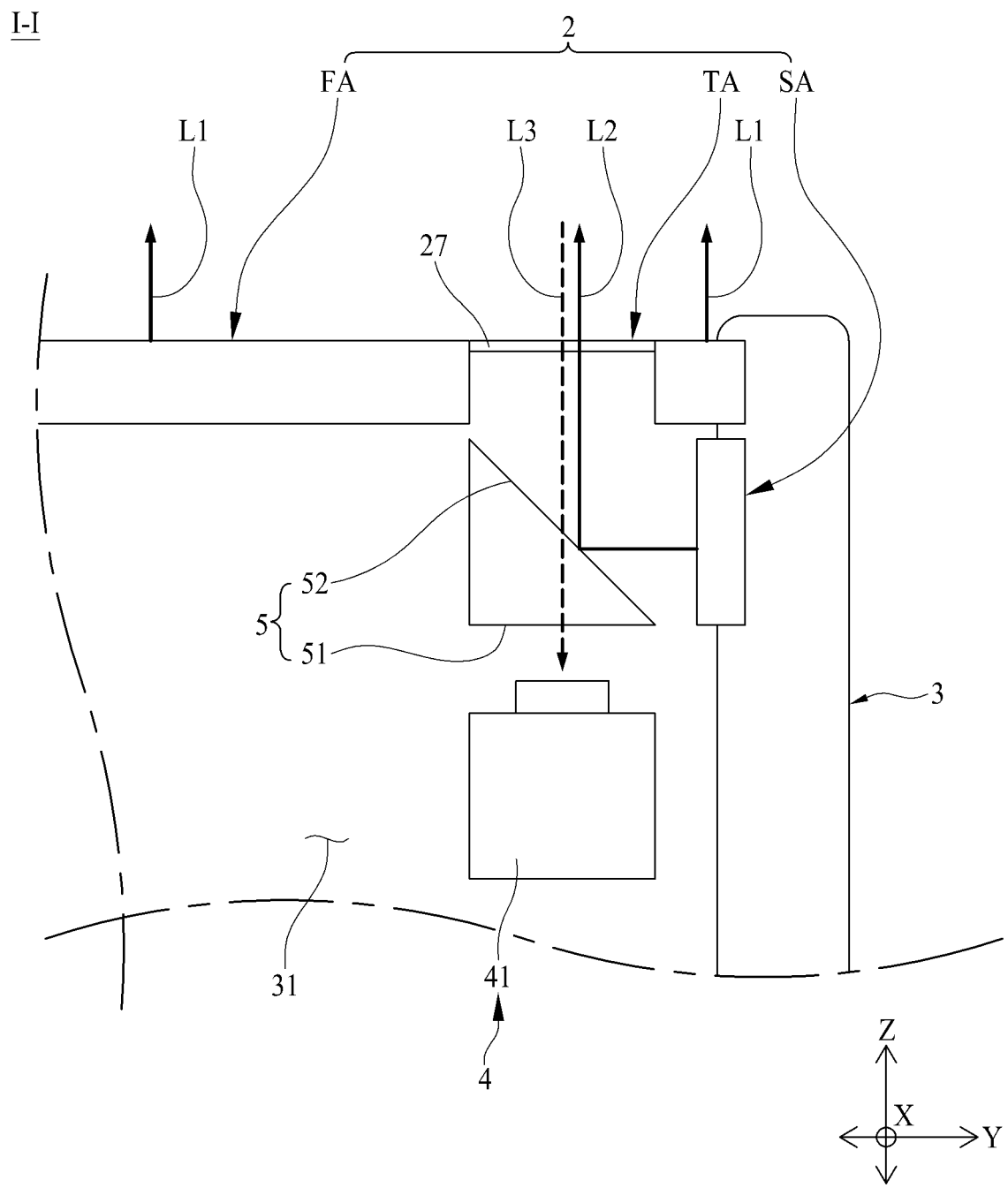
FIG. 12 is a brief cross-sectional view illustrating a display apparatus according to the fifth aspect of the present disclosure.

FIG. 12 is a brief cross-sectional view illustrating a display apparatus according to the fifth aspect of the present disclosure.

Referring to FIG. 12, the display apparatus 1 according to the fifth aspect of the present disclosure is the same as the display apparatus according to FIG. 2 except that each of the front area FA and the side area SA is provided by a separate display panel 2. Therefore, the same reference numerals will be given to the same elements, and different elements will be described hereinafter.

In case of the display apparatus according to FIG. 2, since the front area FA and the side area SA are provided by one display panel 2, the edge portions of the display panel 2 may be bent and folded such that the side area SA may be arranged to face the semi-transmissive mirror 5.

On the other hand, in case of the display apparatus 1 according to the fifth aspect of the present disclosure of FIG. 12, since each of the front area FA and the side area SA is provided by a separate display panel 2, the display panel 2 does not need to be bent and folded. Therefore, as shown in FIG. 12, the display panel 2 arranged in the front area FA may be provided with flatness without being bent. The main body 3 may be coupled to the end of the display panel 2 of the front area FA to support the display panel 2 of the front area FA arranged with flatness. Although FIG. 12 shows that the main body 3 partially covers the upper surface of the display panel 2 of the front area FA, without limitation to this example, the main body 3 may be provided so as not to cover the upper surface of the display panel 2 of the front area FA if it may support the display panel 2 of the front area FA.

Meanwhile, in case of the display apparatus according to FIG. 12, since the side area SA is provided by a separate display panel 2, the side area SA may directly be coupled to the main body 3. Therefore, in the display apparatus 1 according to the fifth aspect of the present disclosure, even though vibration is generated by external impact, the side area SA may be supported more rigidly than the case that the display panel 2 is bent.

However, even in case of the display apparatus according to FIG. 12, the display panel 2 arranged in the side area SA should be operated by interacting with the display panel 2 arranged in the front area FA, the display panel 2 arranged in the side area SA may be connected with the display panel 2 arranged in the front area FA through a line, etc.

Figure 13A:
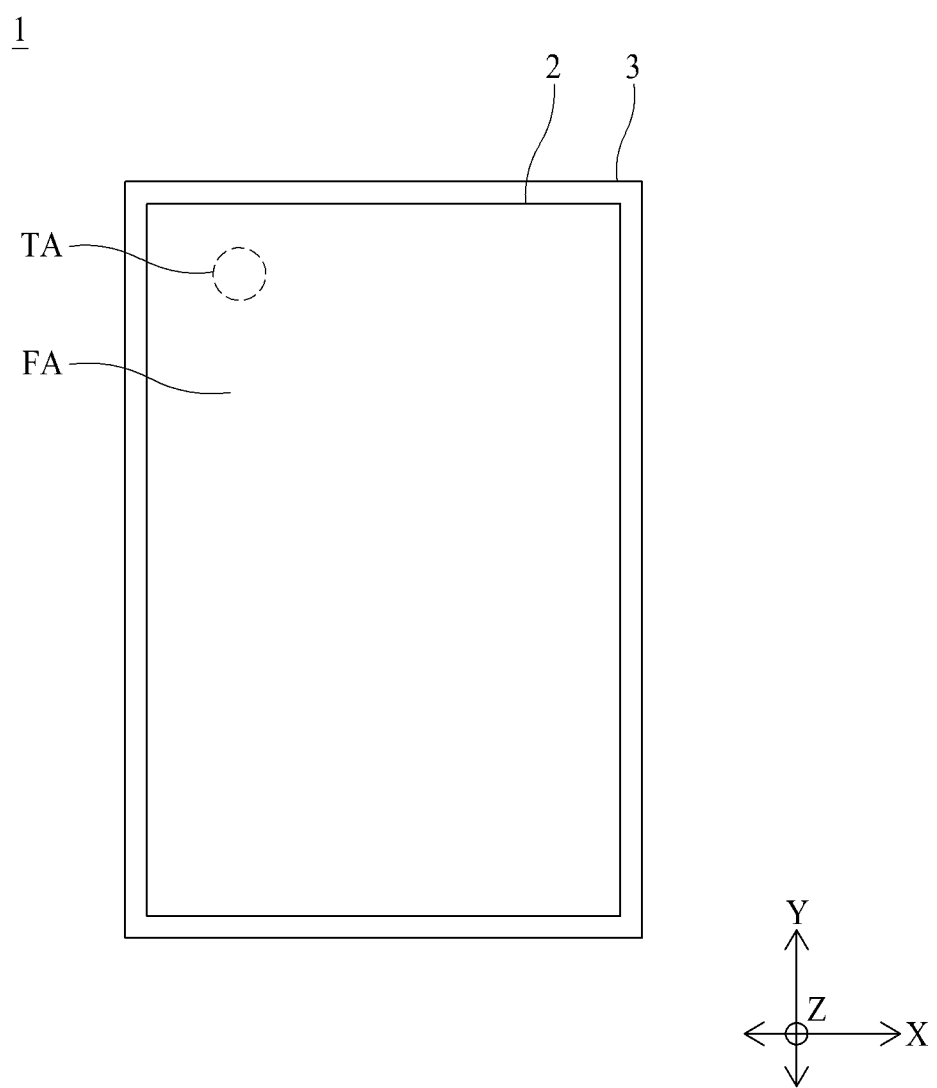
FIGS. 13A to 13C are brief front views illustrating various arrangement positions of a transmissive area of a display apparatus according to the present disclosure.
Figure 13B:
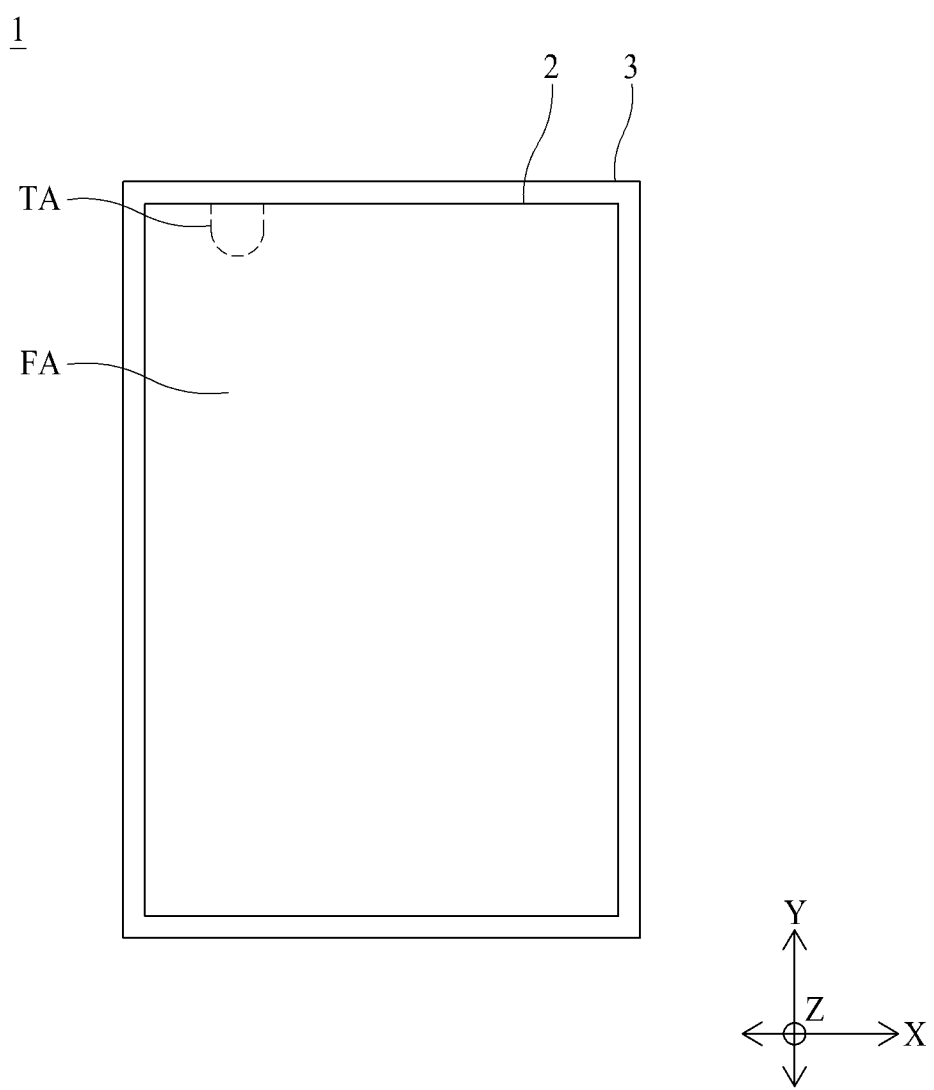
Figure 13C:
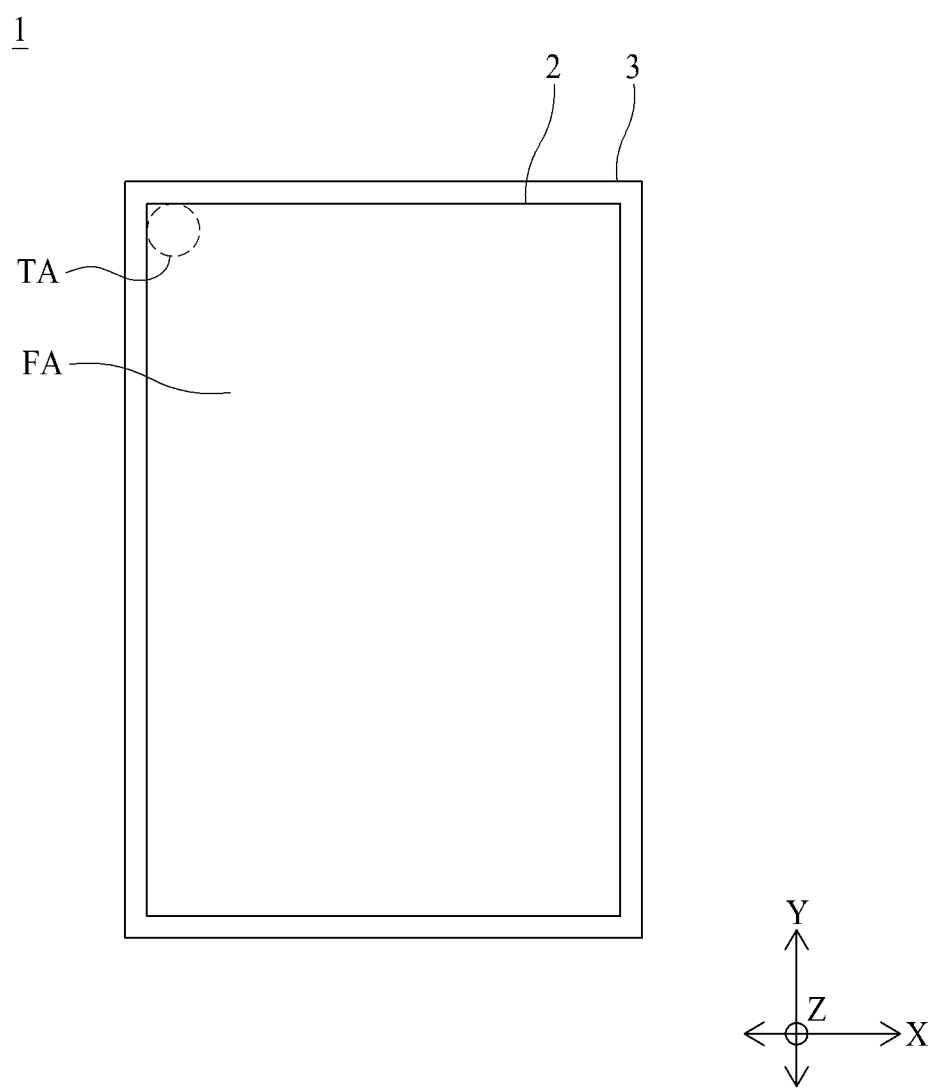

FIG. 13A to 13C are brief front views illustrating various arrangement positions of a display apparatus according to the present disclosure.

FIG. 13A illustrates that the transmissive area TA is arranged at an inner side of the front area FA, FIG. 13B illustrates that the transmissive area TA is arranged at an end portion of the front area FA, and FIG. 13C illustrates that the transmissive area TA is arranged at a corner portion. In FIGS. 13A to 13C, the main body 3 may be a bezel surrounding the display panel 2.

The end portion of the front area FA may be the last end of the front area that is adjacent to the main body 3 or is not covered by the main body 3. The corner portion of the front area FA may be a portion where an upper side and a side of the front area FA are adjacent to each other or a lower side and the side of the front area FA are adjacent to each other. The inner side of the front area FA may be the other portion except the end portion and the corner portion.

First of all, FIG. 13A illustrates that the transmissive area TA is arranged at the inner side of the front area FA, wherein the transmissive area TA may be arranged to be spaced apart from the main body 3 at a predetermined distance. This is because that the side area SA is arranged inside the main body by bending and folding of the edges of the display panel 2 as shown in FIG. 2. That is, since the semi-transmissive mirror 5 should be more spaced apart from the bezel as much as a bending thickness and folding thickness of the edge portions of the display panel 2 to arrange the side area SA inside the main body 3, the transmissive area TA may be arranged at the inner side of the front area FA.

However, without limitation to this example, the transmissive area TA may be arranged at the inner side of the front area FA even in the case that the display panel 2 arranged in the front area FA and the display panel 2 arranged in the side area SA are provided separately. In this case, as shown in FIG. 12, the front area FA for emitting the image light L1 may be arranged above the side area SA.

Therefore, the display apparatus according to one aspect of FIG. 2, the display apparatus according to the second aspect of FIG. 9A, the display apparatus according to the third aspect of FIG. 10, and the display apparatus according to the fifth aspect of FIG. 12 may be provided such that the transmissive area TA is arranged at the inner side of the front area FA as shown in FIG. 13A.

Also, although FIG. 13A shows that only one transmissive area TA is arranged at the inner side of the front area FA, without limitation to this example, a plurality of transmissive areas TA may be arranged at different positions.

Next, FIG. 13B illustrates that the transmissive area TA is arranged at the end portion of the front area FA, wherein the transmissive area TA may be arranged to adjoin the main body 3. This is because that the semi-transmissive mirror 5 is arranged at the side of the substrate 21, the anode 22, the light emitting layer 23, the cathode 24, the encapsulation layer 25, and the polarizer 26 of the display panel 2 as shown in FIG. 11. That is, since the semi-transmissive mirror 5 is arranged to be close to the cover glass 27, the side area SA should be arranged to be close to the cover glass 27 to face the semi-transmissive mirror 5 and the cover glass 27 arranged above the side area SA should be provided opaquely. This is because that the image light L2 emitted from the side area SA may directly be emitted to a user without passing through the semi-transmissive mirror 5 if the cover glass 27 arranged above the side area SA is transparent. Therefore, to avoid this, the cover glass 27 arranged above the side area SA may be provided opaquely or the main body 3 may be provided to cover the cover glass 27 arranged above the side area SA. Therefore, the transmissive area TA may be arranged to adjoin the main body 3, that is, the bezel, as shown in FIG. 13B. The transmissive area TA may be provided in a semi-circle shape as shown in FIG. 13B, but may be provided in another shape such as a circle without limitation to the example of FIG. 13B.

Consequently, the display apparatus according to the fourth aspect of FIG. 11 and the display apparatus according to the fifth aspect of FIG. 12 may be provided such that the transmissive area TA is arranged at the end portion of the front area FA as shown in FIG. 13B. However, in this case, the display apparatus according to the fifth aspect of FIG. 12 may be provided such that the front area FA arranged above the side area SA is provided opaquely or the main body 3 is provided to cover the front area FA arranged above the side area SA.

Meanwhile, FIG. 13B shows that the transmissive area TA is arranged at only an upper side of the front area FA, the transmissive area TA may be arranged at a side or lower side of the front area FA without limitation to the example of FIG. 13B. Also, in FIG. 13B, the plurality of transmissive areas TA may be arranged at the upper side of the front area FA, and the plurality of transmissive areas TA may be arranged at two or more of the upper side, the side and the lower side.

Next, FIG. 13C illustrates that the transmissive area TA is arranged at the corner portion, wherein the transmissive area TA may be arranged to adjoin the upper side and the side of the front area FA or may be arranged to adjoin the lower side and the side of the front area FA. This is, the transmissive area TA may be arranged to adjoin the upper side and the side of the main body 3, or may be arranged to adjoin the lower side and the side of the main body 3. This is because that the semi-transmissive mirror 5 is arranged at the side of the substrate 21, the anode 22, the light emitting layer 23, the cathode 24, the encapsulation layer 25, and the polarizer 26 of the display panel 2 as shown in FIG. 11. Since the semi-transmissive mirror 5 may be arranged to adjoin the side portion of the main body 3 in FIG. 13C, the inclined surface of the semi-transmissive mirror 5 may be arranged to be inclined with respect to the upper side of the main body 3 or arranged to be inclined with respect to the side of the main body 3, whereby the inclined surface of the semi-transmissive mirror 5 may be embodied.

Consequently, the display apparatus according to the fourth aspect of FIG. 11 and the display apparatus according to the fifth aspect of FIG. 12 may be provided such that the transmissive area TA is arranged at the corner portion of the front area FA as shown in FIG. 13C. However, as described above, the display apparatus according to the fifth aspect of FIG. 12 may be provided such that the front area FA arranged above the side area SA is provided opaquely or the main body 3 is provided to cover the front area FA arranged above the side area SA.

Meanwhile, FIG. 13C shows that the transmissive area TA is arranged to adjoin the upper side and the left side of the front area FA, the transmissive area TA may be arranged to adjoin any one of the upper and right sides, the lower and left sides, and the lower and right sides of the front area FA without limitation to the example of FIG. 13C. Also, in FIG. 13C, the plurality of transmissive areas TA may be arranged in at least two or more of the aforementioned arrangement positions.

Although the present disclosure has been described based on that the transmissive area TA is provided in any one of the end portion, the corner portion and the inner side of the front area FA, without limitation to this example, the transmissive area TA may be provided in at least two or more of the end portion, the corner portion and the inner side of the front area FA in accordance with the positions of the auxiliary members 4 provided inside the main body 3.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A display apparatus comprising:
   a display panel having a front area and a side area;
   a main body supporting the display panel;
   an auxiliary member arranged inside the main body; and
   a semi-transmissive mirror arranged between the auxiliary member and the front area,
   wherein the side area of the display panel is arranged inside the main body and faces the semi-transmissive mirror.

2. The display apparatus of claim 1, wherein the front area includes a transmissive area provided in a position corresponding to the auxiliary member, and the semi-transmissive mirror is arranged below the transmissive area.

3. The display apparatus of claim 1, wherein the side area emits an upside down inverted image toward the semi-transmissive mirror, and
   wherein the upside down inverted image is upside down converted from an image emitted from the front area.

4. The display apparatus of claim 3, wherein the upside down inverted image emitted from the side area is reflected on the semi-transmissive mirror and is emitted from the transmissive area without an upside down inversion, and the image emitted from the transmissive area has uniformity with the image emitted from the front area.

5. The display apparatus of claim 2, wherein the transmissive area is provided so as not to emit an image.

6. The display apparatus of claim 2, wherein the semi-transmissive mirror has a size equal to or greater than that of the side area of the display panel.

7. The display apparatus of claim 2, wherein the semi-transmissive mirror has a size equal to or greater than that of the transmissive area.

8. The display apparatus of claim 2, wherein the semi-transmissive mirror includes:
   a flat surface arranged to be parallel with the front area and an inclined surface arranged to be inclined with respect to the flat surface, and
   wherein the inclined surface faces the side area and is arranged below the transmissive area.

9. The display apparatus of claim 1, wherein the display panel includes a substrate, an anode, a light emitting layer, a cathode, a polarizer and a cover glass, and
   wherein the polarizer and the cover glass are not arranged in the side area of the display panel.

10. The display apparatus of claim 1, wherein the side area is provided at a first angle with respect to the front area.

11. The display apparatus of claim 2, wherein the transmissive area is arranged in one of an end portion of the front area, a corner portion, and an inner side spaced apart from the end portion and the corner portion.

12. The display apparatus of claim 8, wherein the inclined surface is arranged at a second angle with respect to the flat surface, and
    wherein the second angle is greater than or equal to 45 degree.

13. The display apparatus of claim 9, wherein the semi-transmissive mirror includes a portion arranged below the substrate.

14. The display apparatus of claim 9, wherein the front area includes a transmissive area provided in a position corresponding to the auxiliary member, and only the cover glass is arranged in the transmissive area.

15. The display apparatus of claim 8, wherein the inclined surface is arranged at a third angle with respect to the flat surface, and wherein the third angle is smaller than 45 degree.

16. The display apparatus of claim 15, wherein a pixel size of the side area with a horizontal length longer than a vertical length is smaller than that of the side area with the horizontal length shorter than the vertical length.

17. The display apparatus of claim 9, wherein the front area includes a transmissive area provided in a position corresponding to the auxiliary member, and the light emitting layer, the cathode and the polarizer are not arranged in the transmissive area.

18. The display apparatus of claim 9, wherein the semi-transmissive mirror is arranged at a side of each of the substrate, the anode, the light emitting layer, the cathode and the polarizer.

19. The display apparatus of claim 18, wherein the semi-transmissive mirror is inserted into the transmissive area.

20. The display apparatus of claim 1, wherein each of the front area and the side area is provided by a separate display panel.

* * * * *